US010276089B2

(12) United States Patent
Takahashi et al.

(10) Patent No.: US 10,276,089 B2
(45) Date of Patent: Apr. 30, 2019

(54) ELECTRONIC DEVICE AND METHOD FOR DRIVING THE SAME

(71) Applicant: Semiconductor Energy Laboratory Co., Ltd., Atsugi-shi, Kanagawa-ken (JP)

(72) Inventors: Minoru Takahashi, Nagano (JP); Kunio Kimura, Kanagawa (JP); Rihito Wada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/632,491

(22) Filed: Jun. 26, 2017

(65) Prior Publication Data

US 2018/0005567 A1 Jan. 4, 2018

(30) Foreign Application Priority Data

Jul. 1, 2016 (JP) .................. 2016-131271
Jul. 1, 2016 (JP) .................. 2016-131274
Jul. 8, 2016 (JP) .................. 2016-135774

(51) Int. Cl.
*G09G 3/32* (2016.01)
*G02F 1/1333* (2006.01)
(Continued)

(52) U.S. Cl.
CPC ............ *G09G 3/32* (2013.01); *G02F 1/1333* (2013.01); *G09G 3/2003* (2013.01);
(Continued)

(58) Field of Classification Search
CPC .................. H04N 1/00835; H01L 27/3232
(Continued)

(56) References Cited

U.S. PATENT DOCUMENTS 6,025,894 A 2/2000 Shirasaki et al.
6,556,260 B1 4/2003 Itou et al.
(Continued)

FOREIGN PATENT DOCUMENTS

JP 2001-066593 A 3/2001
JP 2002-196702 A 7/2002
(Continued)

OTHER PUBLICATIONS

Shieh.H, "Transflective display by Hybrid OLED and LCD", Leos 2005 (IEEE Lasers and Electro-Optics Society Annual Meeting), Oct. 22, 2005, pp. 650-651, IEEE.
(Continued)

*Primary Examiner* — Joseph R Haley
(74) *Attorney, Agent, or Firm* — Fish & Richardson P.C.

(57) ABSTRACT

An electronic device includes a display portion, an imaging portion, a control portion, an input portion, and a sensor portion. The display portion has a first display element that reflects visible light and a second display element that emits visible light. The display portion has a function of displaying an image using one of or both first light reflected by the first display element and second light emitted from the second display element. The imaging portion takes an image of an object, the control portion controls the display portion and the imaging portion, the input portion inputs a signal for controlling the display portion and the imaging portion to the control portion, and the sensor portion outputs sensing data to the control portion, in consideration of illuminance of external light. Such a display device increases the display quality, or keeps high-quality display regardless of environmental conditions and reduces power consumption.

11 Claims, 24 Drawing Sheets

(51) Int. Cl.
*G09G 3/20* (2006.01)
*G09G 3/36* (2006.01)
*H01L 27/32* (2006.01)
*G09G 3/3208* (2016.01)

(52) U.S. Cl.
CPC .............. *G09G 3/2092* (2013.01); *G09G 3/36* (2013.01); *H01L 27/3232* (2013.01); *G02F 2201/44* (2013.01); *G02F 2203/02* (2013.01); *G09G 3/3208* (2013.01); *G09G 3/3648* (2013.01); *G09G 2300/023* (2013.01); *G09G 2300/0426* (2013.01); *G09G 2300/0452* (2013.01); *G09G 2330/023* (2013.01); *G09G 2360/144* (2013.01)

(58) Field of Classification Search
USPC .................................................. 345/5
See application file for complete search history.

(56) References Cited

U.S. PATENT DOCUMENTS

| | | | |
|---|---|---|---|
| 6,714,268 B2 | 3/2004 | Wang et al. | |
| 6,912,021 B2 | 6/2005 | Kimura | |
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,304,696 B2 | 12/2007 | Yamagishi | |
| 7,385,654 B2 | 6/2008 | Mitsui et al. | |
| 7,674,650 B2 | 3/2010 | Akimoto et al. | |
| 7,688,290 B2 | 3/2010 | Yamazaki et al. | |
| 8,040,456 B2 | 10/2011 | Yamazaki et al. | |
| 8,159,449 B2 | 4/2012 | Kimura et al. | |
| 8,547,503 B2 | 10/2013 | Kubota et al. | |
| 8,743,028 B2 | 6/2014 | Yamazaki et al. | |
| 8,836,906 B2 | 9/2014 | Kurokawa et al. | |
| 9,006,755 B2 | 4/2015 | Seo et al. | |
| 9,129,568 B2 | 9/2015 | Kubota et al. | |
| 9,189,997 B2 | 11/2015 | Kimura et al. | |
| 9,934,755 B2 * | 4/2018 | Roh | G09G 5/006 |
| 2003/0102801 A1 | 6/2003 | Senbonmatsu | |
| 2003/0201960 A1 | 10/2003 | Fujieda | |
| 2006/0072047 A1 | 4/2006 | Sekiguchi | |
| 2006/0210263 A1 * | 9/2006 | Oh | G03B 13/02 396/287 |
| 2007/0032161 A1 | 2/2007 | Liao et al. | |
| 2007/0153172 A1 | 7/2007 | Hsieh et al. | |
| 2008/0180618 A1 | 7/2008 | Fujieda | |
| 2010/0171905 A1 | 7/2010 | Huang et al. | |
| 2011/0205468 A1 | 8/2011 | Hirakata et al. | |
| 2011/0249211 A1 | 10/2011 | Song et al. | |
| 2011/0255046 A1 | 10/2011 | Kurokawa et al. | |
| 2012/0208637 A1 | 8/2012 | Hirakata | |
| 2014/0065430 A1 | 3/2014 | Yamazaki et al. | |
| 2014/0146033 A1 | 5/2014 | Koyama et al. | |
| 2014/0285477 A1 * | 9/2014 | Cho | G09G 3/2003 345/207 |
| 2014/0362429 A1 | 12/2014 | Yokozeki et al. | |
| 2015/0029418 A1 | 1/2015 | Ueda et al. | |
| 2015/0179139 A1 | 6/2015 | Watanabe et al. | |
| 2015/0364073 A1 | 12/2015 | Ogawa | |
| 2016/0042702 A1 | 2/2016 | Hirakata et al. | |
| 2016/0283028 A1 | 9/2016 | Yamazaki et al. | |

FOREIGN PATENT DOCUMENTS

| | | |
|---|---|---|
| JP | 2002-328630 A | 11/2002 |
| JP | 2003-098983 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-096055 A | 4/2007 |
| JP | 2007-123861 A | 5/2007 |
| JP | 2007-232882 A | 9/2007 |
| JP | 4161574 | 10/2008 |
| JP | 2013-142804 A | 7/2013 |
| JP | 2013-221965 A | 10/2013 |
| WO | WO-2004/053819 | 6/2004 |

OTHER PUBLICATIONS

Minoura.K et al., "P-149: Super Reflective Color LCDs Being Able to Display Moving Images without Polarizers", SID Digest '06 : SID International Symposium Digest of Technical Papers, Jun. 6, 2006, vol. 37, No. 1, pp. 769-772.

Lee.J et al., "High ambient-contrast-ratio display using tandem reflective liquid crystal display and organic light-emitting device", Optics Express, Nov. 14, 2005, vol. 13, No. 23, pp. 9431-9438.

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

FIG. 7A1 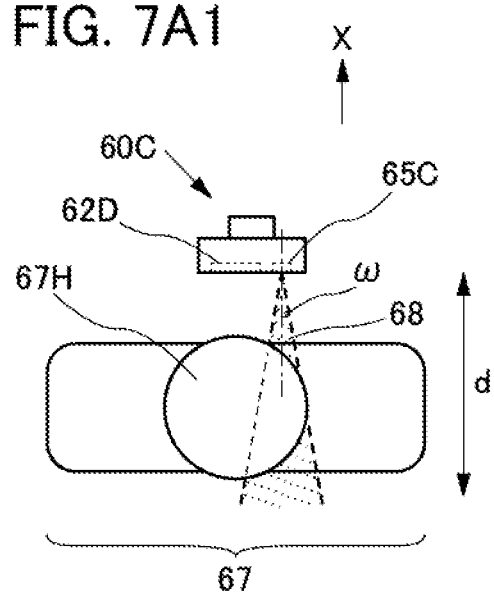
FIG. 7A2 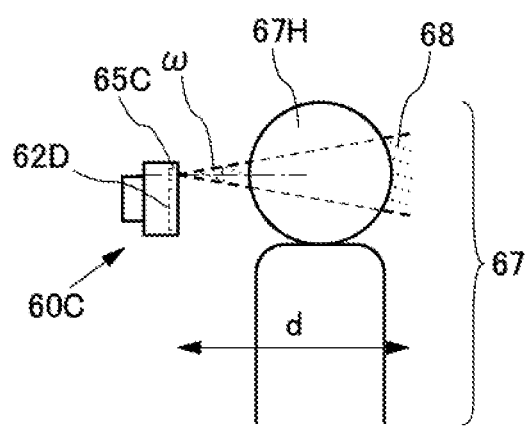
FIG. 7B1 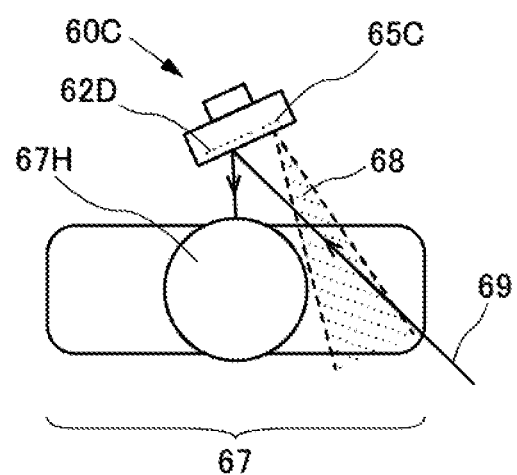
FIG. 7B2 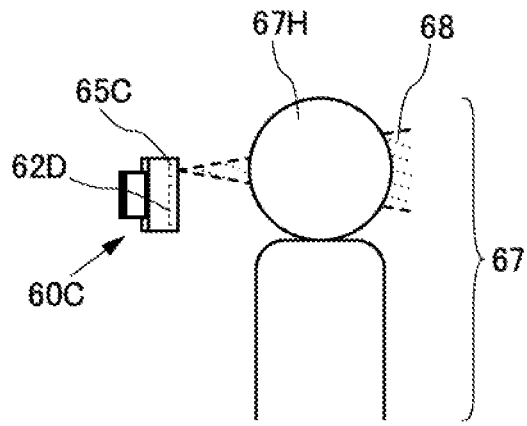

FIG. 17A
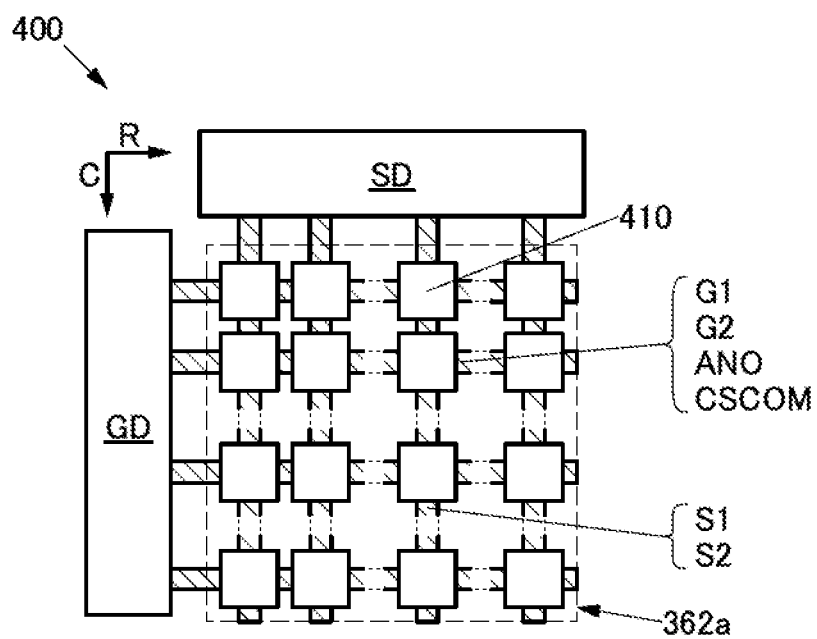
FIG. 17B1
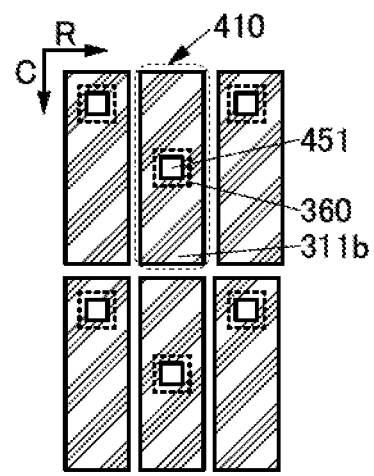
FIG. 17B2
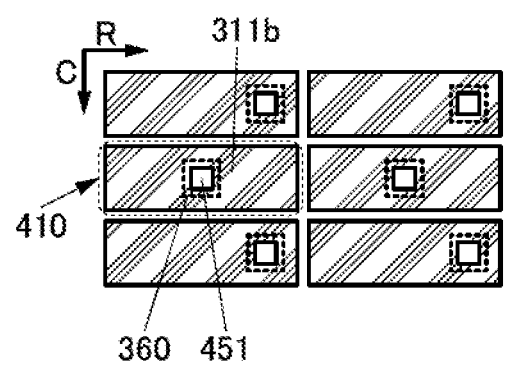

ELECTRONIC DEVICE AND METHOD FOR DRIVING THE SAME

BACKGROUND OF THE INVENTION

1. Field of the Invention

One embodiment of the present invention relates to an electronic device. One embodiment of the present invention relates to a method for driving an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. An imaging device, an electro-optical device, a power generation device (e.g., a thin film solar cell and an organic thin film solar cell), and an electronic device each may include a semiconductor device.

2. Description of the Related Art

An example of a display device is a liquid crystal display device provided with a liquid crystal element. For example, an active matrix liquid crystal display device, in which pixel electrodes are arranged in a matrix and transistors are used as switching elements connected to respective pixel electrodes, has attracted attention.

As switching elements connected to respective pixel electrodes, active matrix liquid crystal display devices including transistors where metal oxide is used for channel formation regions are already known (Patent Documents 1 and 2).

It is known that an active matrix liquid crystal display device is classified into two major types: transmissive type and reflective type.

In a transmissive liquid crystal display device, a backlight such as a cold cathode fluorescent lamp or a light-emitting diode (LED) is used, and optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, those images are combined to display an image.

In a reflective liquid crystal display device, a state in which external light, that is, incident light is reflected at a pixel electrode and output to the outside of the device or a state in which incident light is not output to the outside of the device is selected using optical modulation action of liquid crystal, whereby bright and dark images are displayed. Furthermore, those displays are combined to display an image. Compared to the transmissive liquid crystal display device, the reflective liquid crystal display device has the advantage of low power consumption since the backlight is not used.

REFERENCES

Patent Documents

[Patent Document 1] Japanese Published Patent Application No. 2007-123861
[Patent Document 2] Japanese Published Patent Application No. 2007-096055

SUMMARY OF THE INVENTION

It is required to reduce the power consumption of an electronic device including a display device. In particular, reducing the power consumption of display devices is needed in devices using batteries as power sources, such as digital cameras, mobile phones, smartphones, and tablet terminals, because the display devices consume significant power in such devices.

There is also a demand for portable electronic devices with high visibility both in an environment with strong external light and in an environment with weak external light.

An object of one embodiment of the present invention is to improve the display quality of a display device. Another object of one embodiment of the present invention is to keep high-quality display regardless of environmental conditions. Another object of one embodiment of the present invention is to reduce power consumption of a display device.

One embodiment of the present invention is an electronic device including a display portion, an imaging portion, a control portion, an input portion, and a sensor portion. A first display element and a second display element are included in the display portion. The first display element has a function of reflecting visible light. The second display element has a function of emitting visible light. The display portion has a function of displaying an image using one of or both first light reflected by the first display element and second light emitted from the second display element. The imaging portion has a function of taking an image of an object. The control portion has a function of controlling the display portion and the imaging portion. The input portion has a function of inputting a signal for controlling the display portion and the imaging portion to the control portion.

One embodiment of the present invention is the above-described electronic device that includes a housing. In the above-described electronic device, the display portion is provided for a first surface of the housing, at least part of the imaging portion is provided for a second surface facing the first surface of the housing, the sensor portion has a function of outputting sensing data based on illuminance of external light to the control portion, the sensor portion includes a photosensor, and the photosensor is provided for a third surface that is in contact with the first surface and the second surface of the housing.

One embodiment of the present invention is the above-described electronic device that includes a housing. In the above-described electronic device, the display portion is provided for a first surface of the housing, at least part of the imaging portion is provided for a second surface facing the first surface of the housing, the sensor portion has a function of outputting sensing data based on illuminance of external light to the control portion, the sensor portion includes a first photosensor and a second photosensor, the first photosensor is provided for the first surface, and the second photosensor is provided for the second surface.

One embodiment of the present invention is the above-described electronic device that includes a housing. In the above-described electronic device, the display portion is provided for a first surface of the housing, at least part of the imaging portion is provided for a second surface facing the first surface of the housing, the sensor portion has a function of outputting positional data of an object to be sensed to the control portion, the sensor portion includes a position detection sensor, and the position detection sensor is provided for the first surface.

In the above structure, the first display element is preferably a reflective liquid crystal element.

In the above structure, the second display element is preferably an electroluminescent element.

One embodiment of the present invention is the above-described electronic device in which the display portion includes a first circuit and a second circuit, the first circuit is electrically connected to the first display element, the second circuit is electrically connected to the second display element, and the second display element is between the first circuit and the second circuit.

One embodiment of the present invention is the above-described electronic device in which the second display element includes a first conductive layer, a second conductive layer, and a layer containing a light-emitting material between the first conductive layer and the second conductive layer, and the first conductive layer has a function of transmitting visible light, is electrically connected to a wiring to which a constant potential is applied, and is between the first circuit and the second circuit.

One embodiment of the present invention is a driving method for the above-described electronic device. The driving method includes displaying an image by the display portion using the first light in the case where illuminance measured by the photosensor is higher than or equal to first illuminance, and displaying an image by the display portion using the second light in the case where illuminance measured by the photosensor is lower than the first illuminance. In the driving method, the first illuminance is higher than or equal to 300 lx and lower than or equal to 20000 lx.

One embodiment of the present invention is a driving method for the above-described electronic device. The driving method includes displaying an image by the display portion using one of the first light and the second light in the case where first illuminance measured by the first photosensor is higher than second illuminance measured by the second photosensor, and displaying an image by the display portion using the first light and the second light in the case where the first illuminance is lower than the second illuminance.

One embodiment of the present invention is a driving method for the above-described electronic device. The driving method includes displaying an image by the display portion using one of the first light and the second light in the case where first illuminance measured by the first photosensor is lower than second illuminance measured by the second photosensor, and displaying an image by the display portion using the first light and the second light in the case where the first illuminance is higher than the second illuminance.

One embodiment of the present invention is a driving method for the above-described electronic device. The driving method includes displaying an image by the display portion using the first light in the case where the position detection sensor detects the object, and displaying an image by the display portion using the first light and the second light in the case where the position detection sensor does not detect the object.

One embodiment of the present invention is the above-described driving method for the electronic device in which the position detection sensor is capable of detecting the object with an angle of view of larger than or equal to 1° and smaller than or equal to 20°.

One embodiment of the present invention is the above-described driving method for the electronic device in which the position detection sensor is capable of detecting the object with a distance of longer than or equal to 100 mm and shorter than or equal to 500 mm.

One embodiment of the present invention can improve the display quality of a display device. Furthermore, a display device that keeps high-quality display regardless of environmental conditions can be provided. Furthermore, power consumption of a display device can be reduced.

BRIEF DESCRIPTION OF THE DRAWINGS

FIGS. 7A1, 7A2, 7B1, and 7B2 illustrate positional relations between a user and an electronic device.

FIG. 17A illustrates a circuit of a display device and FIGS. 17B1 and 17B2 are top views of pixels.

DETAILED DESCRIPTION OF THE INVENTION

Figure 1:
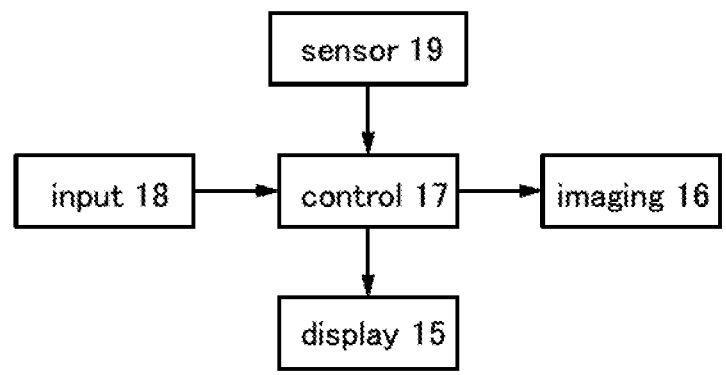
FIG. 1 is a block diagram showing a main structure of an electronic device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

(Embodiment 1)

In this embodiment, an electronic device of one embodiment of the present invention will be described.

FIG. 1 is a block diagram showing an example of a main structure of an electronic device. In FIG. 1, two elements connected by an arrow are electrically connected to each other with or without a wire. Furthermore, the direction of an arrow indicates the direction in which a signal is output.

The electronic device of one embodiment of the present invention includes a display portion 15, an imaging portion 16, a control portion 17, an input portion 18, and a sensor portion 19. The electronic device is also referred to as a camera, a digital camera, or a digital video camera.

The display portion 15 has a function of displaying an image or video. The imaging portion 16 has a function of taking an image of an object. The control portion 17 has a function of controlling the operation of the display portion 15 and the imaging portion 16.

The input portion 18 has a function of outputting a signal to the control portion 17. Specifically, the input portion 18 has a function of outputting, to the control portion 17, a signal with which the control portion 17 controls the display portion 15 and the imaging portion 16. A user operates the electronic device with the input portion 18.

The sensor portion 19 has a function of outputting, to the control portion 17, sensing data based on illuminance of external light sensed by the sensor portion 19. The sensor portion 19 has a function of outputting, to the control portion 17, positional data of an object to be sensed by the sensor portion 19, e.g., positional data of a user. Owing to the sensor portion 19 of the electronic device, the display portion 15 can perform display in accordance with illuminance of a use environment.

<Structure Example 1 of Electronic Device>

Figure 2A:
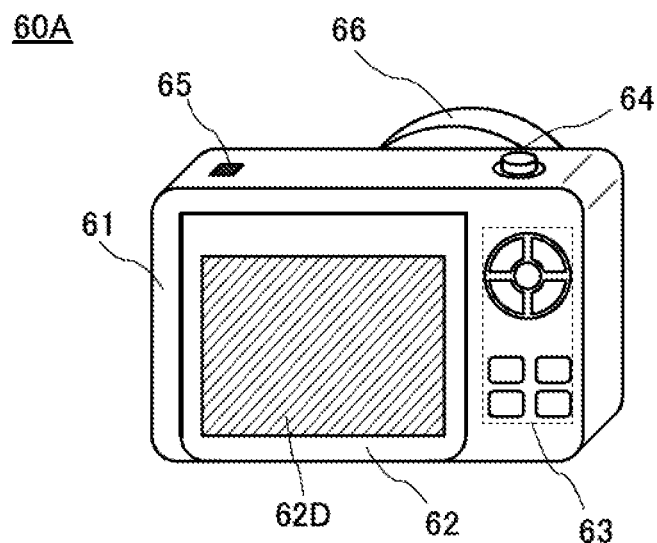
FIGS. 2A and 2B are a rear perspective view and a front perspective view of an electronic device.
Figure 2B:
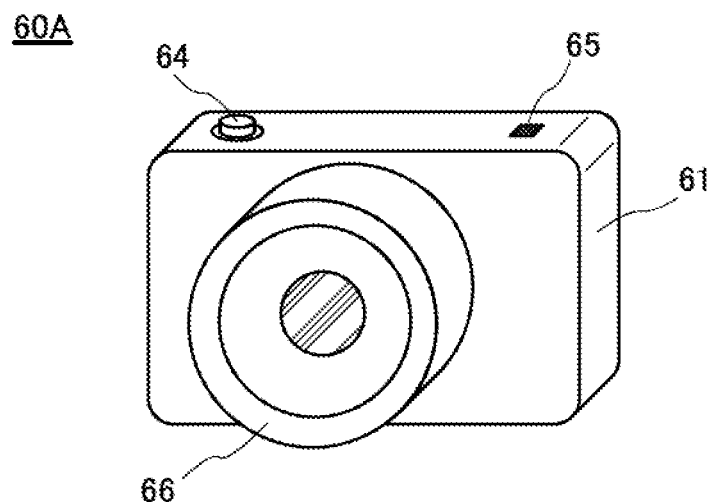
Figure 3:
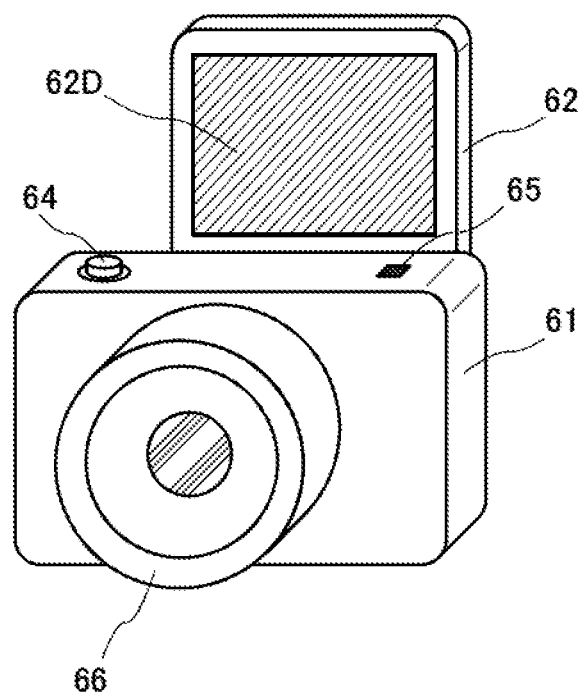
FIG. 3 is a front perspective view of an electronic device.

A specific structure example of an electronic device of one embodiment of the present invention is described with reference to FIGS. 2A and 2B and FIG. 3. FIG. 2A is a perspective view of the rear side of an electronic device 60A. FIG. 2B and FIG. 3 are perspective views of the front side of the electronic device 60A.

The electronic device 60A includes a housing 61, a display device 62, operation buttons 63, a shutter button 64, a photosensor 65, an imaging portion 16, and a control portion. The display device 62 includes a display portion 62D.

The display portion 62D is an example of the display portion 15 shown in FIG. 1. The operation buttons 63 and the shutter button 64 are an example of the input portion 18 shown in FIG. 1. The photosensor 65 is an example of the sensor portion 19 shown in FIG. 1. Note that the control portion that corresponds to the control portion 17 shown in FIG. 1 is not shown in FIGS. 2A and 2B.

The display portion 62D is provided for the display device 62. The display device 62 is provided for a first surface of the housing 61. That is, the display portion 62D is provided for the first surface of the housing 61 (see FIG. 2A). A lens 66 is provided for a second surface facing the first surface of the housing 61 (see FIG. 2B). The photosensor 65 is provided for a third surface that is in contact with the first surface and the second surface of the housing 61. The shutter button 64 is provided for the third surface. The third surface is preferably a top surface of the electronic device 60A.

As the photosensor 65, a photoelectric conversion element such as a photodiode can be used in a light detection portion, for example. The photosensor 65 can measure illuminance of external light on the basis of the amount of current flowing in the photoelectric conversion element.

The imaging portion 16 includes an imaging element and an optical system for forming an image on the imaging element. As the imaging element, a charge coupled device (CCD) or a complementary metal oxide semiconductor (CMOS) can be used, for example. As the optical system, a lens, a diaphragm, an auto-focusing system, or the like can be used. In the imaging portion 16, only the lens 66 is shown in FIGS. 2A and 2B.

The operation buttons 63 are provided for the first surface of the housing 61. A user can operate the electronic device 60A with the operation buttons 63 and the shutter button 64. With the operation buttons 63, a still image or a moving image can be displayed on the display portion 62D and shooting conditions such as exposure and zooming can be set, for example. With the shutter button 64, the electronic device can be focused on an object and an image of an object can be taken, for example.

The display device 62 is connected to the housing 61 by a movable portion (not shown) provided between the display device 62 and the housing 61. Owing to the movable portion of the electronic device 60A, the display device 62 can be drawn to the rear (the first surface side). Furthermore, the movable portion of the electronic device 60A makes the display device 62 with a state in which a display surface of the display portion 62D and the front (the second surface) of the display device 62 are heading in the same direction. FIG. 3 is a perspective view of the front side of the electronic device 60A in the state in which the display surface of the display portion 62D and the second surface are heading in the same direction. With the electronic device 60A in the state shown in FIG. 3, a user can take an image of part of the user himself/herself (e.g., the user's face or upper body), i.e., a self-portrait image.

The display portion 62D is described.

In the display portion 62D, a first display element that reflects visible light and a second display element that emits visible light are provided.

The display portion 62D has a function of displaying an image using one or both of first light reflected by the first display element and second light emitted by the second display element. Alternatively, the display device has a function of producing gray levels by controlling the amount of the first light reflected by the first display element and the amount of the second light emitted by the second display element.

The display portion 62D preferably includes first pixels each of which produces gray levels by controlling the amount of light reflected by the first display element and second pixels each of which produces gray levels by controlling the amount of light emitted by the second display element. The first pixels and the second pixels are arranged, for example, in a matrix to form the display portion 62D.

The first pixels and the second pixels are preferably arranged at regular intervals in a display region. The first pixel and the second pixel adjacent to each other can be collectively referred to as a pixel unit.

Furthermore, the first pixels and the second pixels are preferably mixed in the display region of the display device. In that case, an image displayed by a plurality of first pixels, an image displayed by a plurality of second pixels, and an image displayed by both the plurality of first pixels and the plurality of second pixels can be displayed in the same display region, as described later.

As the first display element included in the first pixel, an element which performs display by reflecting external light can be used. Such an element does not include a light source and thus power consumption in display can be significantly reduced. Furthermore, in the case where the electronic device is used in an environment where illuminance of external light is high, e.g., outdoors under a clear sky, display can be performed with high luminance in accordance with the illuminance, so that display with high visibility can be performed.

As the first display element, a reflective liquid crystal element can typically be used. Alternatively, as the first display element, an element using a microcapsule method, an electrophoretic method, an electrowetting method, an Electronic Liquid Powder (registered trademark) method, or the like can be used, other than a Micro Electro Mechanical Systems (MEMS) shutter element or an optical interference type MEMS element.

As the second display element included in the second pixel, an element which includes a light source and performs display using light from the light source can be used. It is particularly preferable to use an electroluminescent element in which light emission from a light-emitting substance can be extracted by application of an electric field. Since the luminance and the chromaticity of light emitted from such a pixel are not affected by external light, an image with high color reproducibility (a wide color gamut) and a high contrast, i.e., a clear image can be displayed.

As the second display element, a self-luminous light-emitting element such as an organic light-emitting diode (OLED), a light-emitting diode (LED), and a quantum-dot light-emitting diode (QLED) can be used. Alternatively, a combination of a backlight as a light source and a transmissive liquid crystal element which controls the amount of transmitted light emitted from a backlight may be used as the second display element.

The first pixel can include subpixels which emit white (W) light or subpixels which emit light of three colors of red (R), green (G), blue (B), for example. The second pixel can also include subpixels which emit white (W) light or subpixels which emit light of three colors of red (R), green (G), and blue (B), for example. Note that the first pixel and the second pixel may each include subpixels of four colors or more. As the number of kinds of subpixels increases, power consumption can be reduced and color reproducibility can be improved.

In the display portion 62D, switching between a first display mode in which an image is displayed by the first pixels, a second display mode in which an image is displayed by the second pixels, and a third display mode in which an image is displayed by the first pixels and the second pixels can be performed.

In the first display mode, an image is displayed using light reflected by the first display element. The first display mode is a driving mode with extremely low power consumption because a light source is unnecessary, and is effective in the case where, for example, external light has sufficiently high illuminance and is white light or light near white light. The first display mode is a display mode suitable for displaying text information of a book or a document, for example. The first display mode can offer eye-friendly display owing to the use of reflected light and thus has an effect of being unlikely to cause eyestrain.

In the second display mode, an image is displayed using light emitted by the second display element. Thus, an extremely clear image (with a high contrast and high color reproducibility) can be displayed regardless of the illuminance and chromaticity of external light. For example, the second display mode is effective in the case where the illuminance of external light is extremely low, such as during the nighttime or in a dark room. When a bright image is displayed under weak external light, a user may feel that the image is too bright. To prevent this, an image with reduced luminance is preferably displayed in the second display mode. In that case, reducing luminance can achieve low power consumption as well as preventing brightness. The second display mode is a mode suitable for displaying a vivid image and a smooth moving image, for example.

In the third display mode, display is performed using both light reflected by the first display element and light emitted by the second display element. Specifically, the electronic device is driven so that light emitted from the first pixel and light emitted from the second pixel adjacent to the first pixel are mixed to express one color. A clearer image than that in the first display mode can be displayed and power consumption can be lower than that in the second display mode. For example, the third display mode is effective when the illuminance of external light is relatively low, such as under indoor illumination or in the morning or evening, or when the external light does not represent a white chromaticity. In the case where the illuminance of external light is high and the light source of external light is reflected on the display portion (in the case where a user sees the light source of external light that is reflected on the surface of the display portion), the visibility can be increased by increasing the luminance in the third display mode.

In the electronic device 60A, the photosensor 65 is provided for the third surface of the housing 61 (see FIGS. 2A and 2B). A threshold value is set on illuminance measured by the photosensor 65. Thus, the display portion 62D can perform display in the first display mode in the case where the value measured by the photosensor 65 is higher than or equal to the threshold value, and the display portion 62D can perform display in the second display mode in the case where the measured value is lower than the threshold value. Such a driving method for the electronic device 60A produces the following effect. That is, in the case where the electronic device 60A is used in a bright environment, the display portion 62D can display an image with low power consumption and high luminance with high visibility. Furthermore, in the case where the electronic device 60A is used in a dark environment, the display portion 62D can display a vivid image with luminance that is low but not so low as to impair visibility.

The above-described threshold value is preferably higher than or equal to 300 lx and lower than or equal to 20000 lx, more preferably higher than or equal to 1000 lx and lower than or equal to 15000 lx, still more preferably higher than or equal to 5000 lx and lower than or equal to 10000 lx.

Note that the display portion 62D may perform display in the third display mode in the case where the measured value is higher than or equal to the threshold value. The photosensor 65 may be provided for the first surface or the second surface, not the third surface. Instead of including the photosensor 65, the electronic device 60A may include the imaging portion 16 that has a function of measuring illuminance of external light.

By changing the display mode of the display portion 62D in accordance with a mode for use of the electronic device 60A, the power consumption of the electronic device 60A can be reduced. For example, only at the time for focusing the electronic device 60A in a mode of shooting a still image, display is performed in the third display mode, and in modes other than the mode, display is performed in the first display mode, whereby the power consumption of the electronic device 60A can be reduced. As another example, only at the time for performing shooting in a mode of shooting a moving image, display is performed in the third display mode, and in modes other than the mode, display is performed in the first display mode, whereby the power consumption of the electronic device 60A can be reduced. As another example, only in a mode of displaying a still image or a moving image that is shot on the display portion 62D, display is performed in the third display mode, and in modes other than the mode, display is performed in the first display mode, whereby the power consumption of the electronic device 60A can be reduced.

<Structure Example 2 of Electronic Device>

Figure 4A:
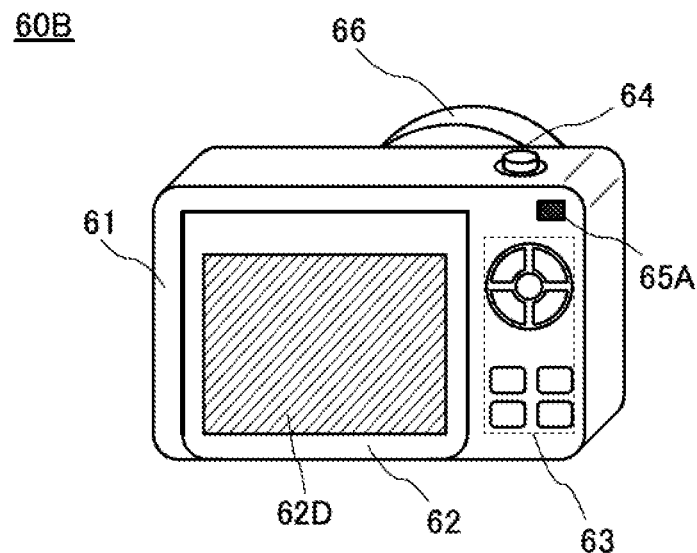
FIGS. 4A and 4B are a rear perspective view and a front perspective view of an electronic device.

A specific structure example of an electronic device of one embodiment of the present invention that has a structure partly different from that of the electronic device 60A is described below with reference to FIGS. 4A and 4B and FIG. 5. FIG. 4A is a perspective view of the rear side of an electronic device 60B, and FIG. 4B and FIG. 5 are perspective views of the front side of the electronic device 60B.

The electronic device 60B is different from the electronic device 60A in that the electronic device 60B includes a photosensor 65A and a photosensor 65B instead of including the photosensor 65. For components of the electronic device 60B that are the same as those of the electronic device 60A, the description of the electronic device 60A can be referred to.

Figure 4B:
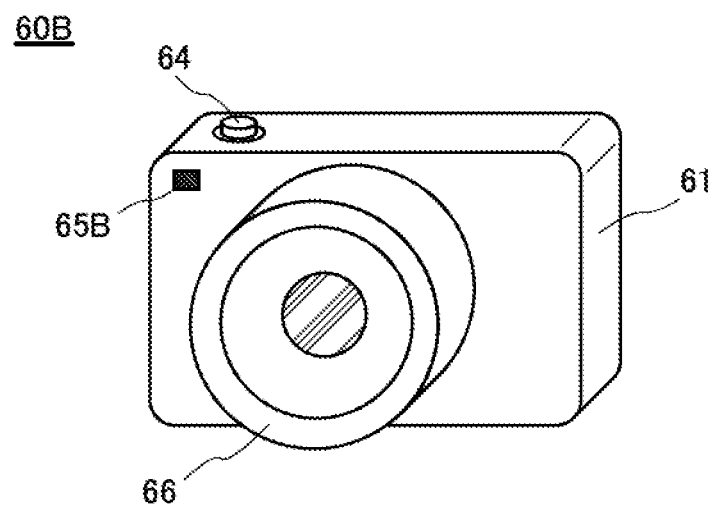
Figure 5:
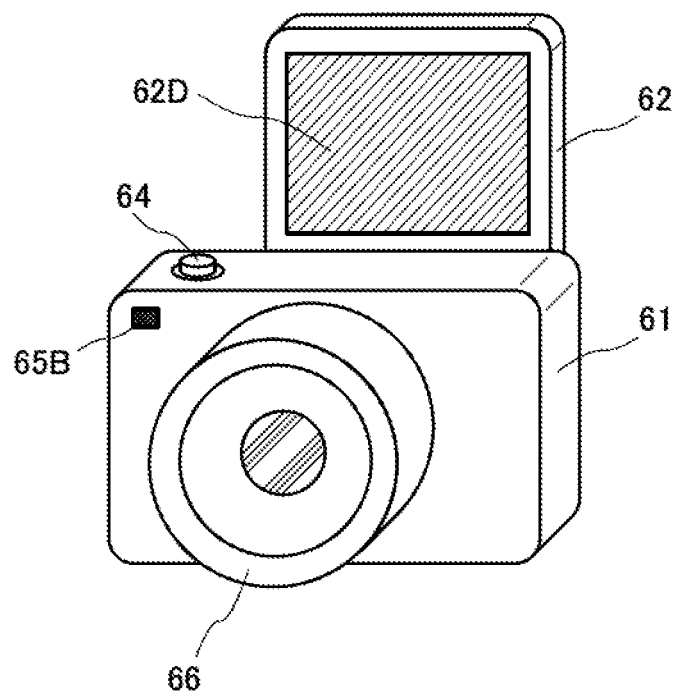
FIG. 5 is a front perspective view of an electronic device.

The photosensor 65A is provided for the first surface of the housing 61, and the photosensor 65B is provided for the second surface of the housing 61 (see FIGS. 4A and 4B). The photosensor 65A and the photosensor 65B can have a structure similar to that of the photosensor 65.

In the electronic device 60B having such a structure, brightness of external light on the rear side of the electronic device 60B, i.e., illuminance measured by the photosensor 65A (hereinafter also referred to as first illuminance) can be compared with brightness of external light on the front side of the electronic device 60B, i.e., illuminance measured by the photosensor 65B (hereinafter also referred to as second illuminance), so that the display mode of the display portion 62D can be changed in accordance with the magnitude relation between the first illuminance and the second illuminance.

Specifically, the display portion 62D performs display in the third display mode in the case where the first illuminance is higher than the second illuminance, and the display portion 62D performs display in the first display mode or the second display mode in the case where the first illuminance is lower than the second illuminance (such display setting is hereinafter also referred to as first setting mode). By driving the electronic device 60B in the first setting mode, a user can perform shooting while seeing an image displayed with high illuminance and favorable visibility in the case where the electronic device 60B is in a state shown in FIG. 5 and a light source of external light is positioned on the rear side of the housing 61 (e.g., in the case where a self-portrait image is taken in a frontlighting situation).

As another example, the display portion 62D may perform display in the third display mode in the case where the first illuminance is lower than the second illuminance, and the display portion 62D may perform display in the first display mode or the second display mode in the case where the first illuminance is higher than the second illuminance (such display setting is hereinafter also referred to as second setting mode). By driving the electronic device 60B in the second setting mode, a user can perform shooting while seeing an image displayed with high luminance and favorable visibility when the electronic device 60B is in a state shown in FIG. 4A and a light source of external light is positioned on the front side of the housing 61 (e.g., an image of an object positioned on the front side of the housing 61 is taken in a backlighting situation).

Thus, a user can perform shooting in various scenes as described above while seeing an image displayed with high luminance and high visibility by using the first setting mode for driving the electronic device 60B when shown in FIG. 5 (i.e., a state in which the display surface of the display portion 62D and the second surface are heading in the same direction) and by using the second setting mode for driving the electronic device 60B when shown in FIG. 4A (i.e., a state in which the display surface of the display portion 62D and the first surface are heading in the same direction), for example.

Note that in this specification, the frontlighting situation refers to a situation in which the light source of external light is positioned on the front side of an object and the rear side of the electronic device, provided that a surface of the object and the second surface of the electronic device which face each other are regarded as their respective "front". Furthermore, the backlighting situation refers to a situation in which the light source of external light is positioned on the rear side of an object and the front side of the electronic device, provided that the surface of the object and the second surface of the electronic device which face each other are regarded as their respective "front".

<Structure Example 3 of Electronic Device>

Figure 6A:
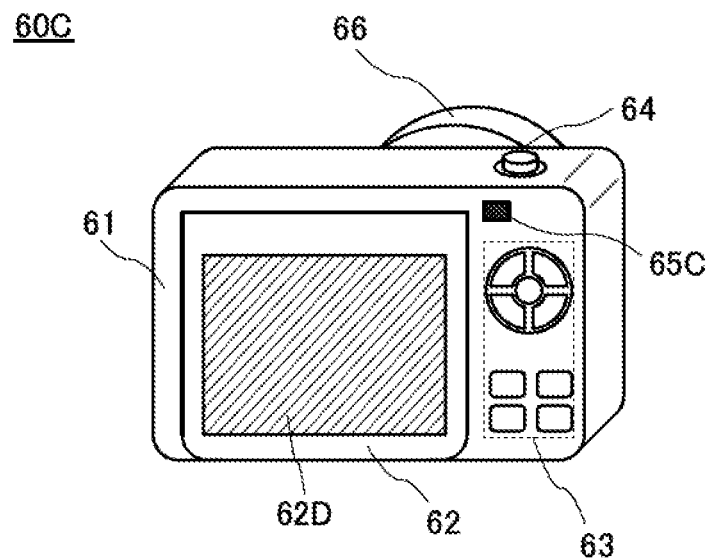
FIGS. 6A and 6B are a rear perspective view and a front perspective view of an electronic device.
Figure 6B:
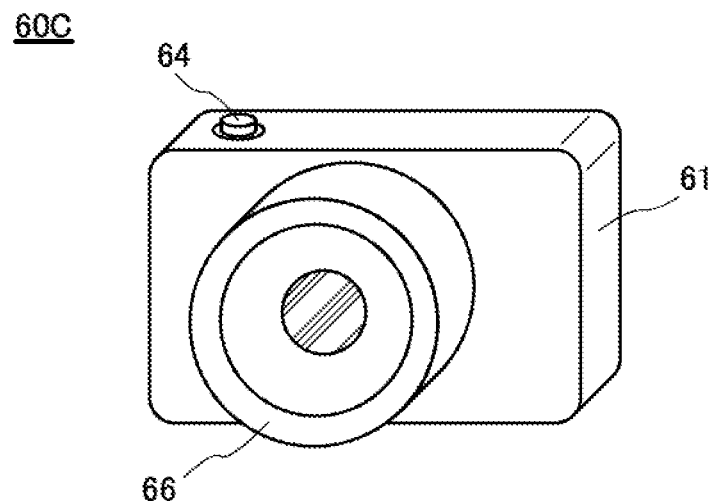

A specific structure example of an electronic device of one embodiment of the present invention that has a structure partly different from that of the electronic device 60A is described below with reference to FIGS. 6A and 6B and FIGS. 7A1, 7A2, 7B1, and 7B2. FIG. 6A is a perspective view of the rear side of an electronic device 60C, and FIG. 6B is a perspective view of the front side of the electronic device 60C.

The electronic device 60C is different from the electronic device 60A in that the electronic device 60C includes a position detection sensor 65C instead of including the photosensor 65. For components of the electronic device 60C that are the same as those of the electronic device 60A, the description of the electronic device 60A can be referred to.

The position detection sensor 65C is an example of the sensor portion 19 shown in FIG. 1.

In the electronic device 60C, the position detection sensor 65C is provided for the first surface of the housing 61 (see FIG. 6A). By setting the distance and the angle of view of the extent of the world detectable by the position detection sensor 65C, the display portion 62D can perform display in the first display mode in the case where a user is detected by the position detection sensor 65C and perform display in the third display mode in the case where the user is not detected by the position detection sensor 65C. Such a driving method of the electronic device 60C produces the following effect. That is, an image with favorable visibility can be displayed in the case where the electronic device 60C is in a state shown in FIG. 6A and the light source of external light is positioned on the rear side of the housing 61 (e.g., in the case where an image of an object positioned on the front side of the electronic device 60C is taken in a frontlighting situation), regardless of the position and the angle of the electronic device 60C held by the user.

As the position detection sensor 65C, an element that senses visible light such as a charge coupled device (CCD) sensor or a complementary metal-oxide-semiconductor (CMOS) sensor can be used. Alternatively, an infrared ray sensor, an ultrasonic wave sensor, or the like may be used. The position detection sensor 65C that is provided for the first surface of the housing 61 can detect positional data of a user of the electronic device 60C. For example, a user who faces the first surface of the housing 61 is detected by the position detection sensor 65C, whereas a user who does not face the first surface of the housing 61 is not detected by the position detection sensor 65C.

FIGS. 7A1, 7A2, 7B1, and 7B2 are schematic views showing the positional relations between the electronic device 60C and a user using the electronic device 60C. FIG. 7A1 is a top view illustrating the case where the direction in which a user 67 faces is approximately parallel to the shooting direction of the electronic device 60C (the arrow X shown in FIG. 7A1), and FIG. 7B1 is a top view illustrating the case where the shooting direction of the electronic device 60C is tilted at a certain angle relative to the direction in which the user 67 faces. FIGS. 7A2 and 7B2 are side views corresponding to the positional relations shown in FIGS. 7A1 and 7B1, respectively. In FIGS. 7A1, 7A2, 7B1, and 7B2, the user uses the electronic device 60C outdoors, and a light source of external light that is not shown, e.g., the sun, is on the rear side of the user 67. Note that a hand of the user 67 that holds the electronic device 60C is not shown in FIGS. 7A1, 7A2, 7B1, and 7B2.

A region 68 shown in FIGS. 7A1, 7A2, 7B1, and 7B2 indicates the range in which the position detection sensor 65C can detect an object (the range is hereinafter also referred to as detection range). The detection range can be defined by an angle of view ω and a distance d from the position detection sensor 65C in the direction perpendicular to the first surface (see FIGS. 7A1 and 7A2).

In a state shown in FIGS. 7A1 and 7A2, a shadow of the user 67 is cast on the display portion 62D, whereby the light source is prevented from being reflected on the display portion 62D (being seen by the user 67 because of reflection on the surface of the display portion 62D). In that state, a head 67H of the user 67 is positioned in the detection range; thus, the position detection sensor 65C detects an object, i.e., the user 67, so that the display portion 62D performs display in the first display mode.

In a state shown in FIGS. 7B1 and 7B2, a shadow of the user 67 is not cast on the display portion 62D depending on the position of the light source, and the light source is reflected on the display portion 62D in some cases. FIG. 7B1 shows the state where light 69 emitted from the light source is reflected on the surface of the display portion 62D and thus seen by the user 67. In that state, the user 67 is positioned outside the detection range; thus, the position detection sensor 65C does not detect an object, i.e., the user 67, and the display portion 62D performs display in the third display mode.

As described above, in the case where the reflection of the light source occurs, the third display mode is used in which display is performed with high illuminance and high visibility, and in the case where the reflection of the light source does not occur, the first display mode is used in which the display portion 62D consumes less power. Thus, the power consumption of the electronic device 60C can be reduced, and the display portion 62D can perform display with favorable visibility regardless of the angle and the position of the electronic device 60C held by the user.

Such changes of the display modes can be achieved on the basis of the detection state of the position detection sensor 65C by setting the angle of view ω and the distance d in FIGS. 7A1 and 7A2 to appropriate values. The angle of view ω is preferably larger than or equal to 1° and smaller than or equal to 20°, more preferably larger than or equal to 3° and smaller than or equal to 10°, for example. The distance d is preferably longer than or equal to 100 mm and shorter than or equal to 500 mm, more preferably longer than or equal to 150 mm and shorter than or equal to 300 mm, for example.

At least part of this embodiment can be implemented in combination with any of the other embodiments described in this specification as appropriate.

(Embodiment 2)

In this embodiment, specific structure examples of the display device 62 described in Embodiment 1 will be described with reference to drawings.

[Structure Example of Display Device]

Figure 8:
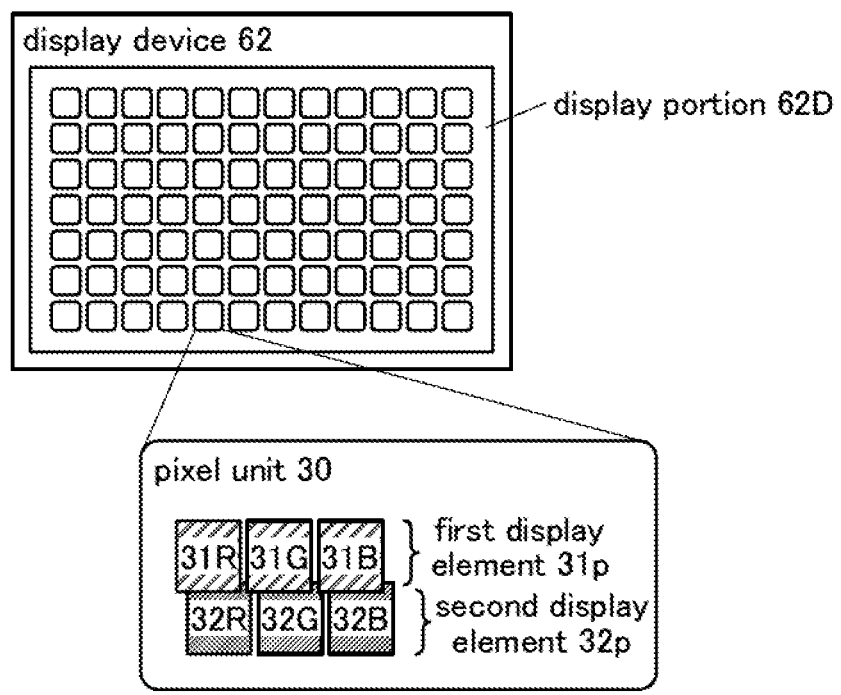
FIG. 8 is a block diagram of a display device.

FIG. 8 is a block diagram of the display device 62. The display device 62 includes the display portion 62D.

The display portion 62D includes a plurality of pixel units 30 arranged in a matrix. The pixel unit 30 includes a first pixel 31$p$ and a second pixel 32$p$.

FIG. 8 shows an example where the first pixel 31$p$ and the second pixel 32$p$ each include display elements for three colors of red (R), green (G), and blue (B).

The first pixel 31$p$ includes a display element 31R for red (R), a display element 31G for green (G), and a display element 31B for blue (B). The display elements 31R, 31G, and 31B each utilize reflection of external light.

The second pixel 32$p$ includes a display element 32R for red (R), a display element 32G for green (G), and a display element 32B for blue (B). The display elements 32R, 32G, and 32B each utilize light of a light source.

[Structure Examples of Pixel Unit]

Figure 9A:
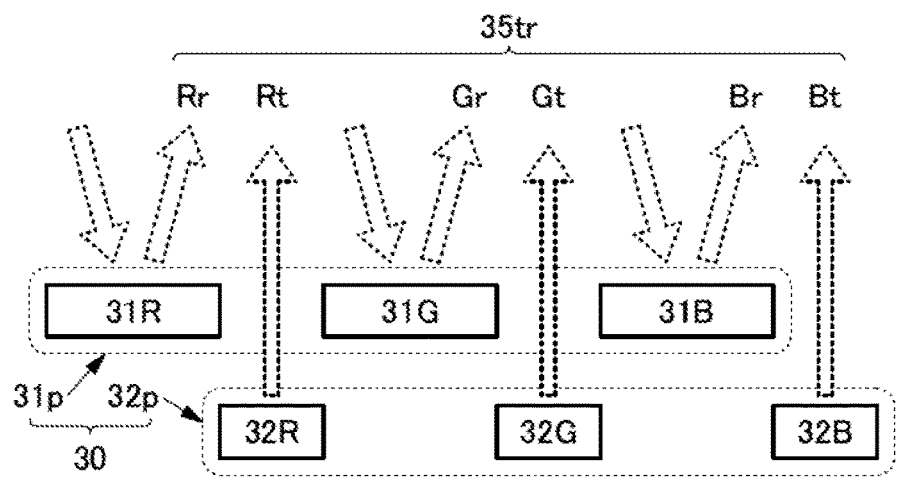
FIGS. 9A to 9C illustrate pixel units.
Figure 9B:
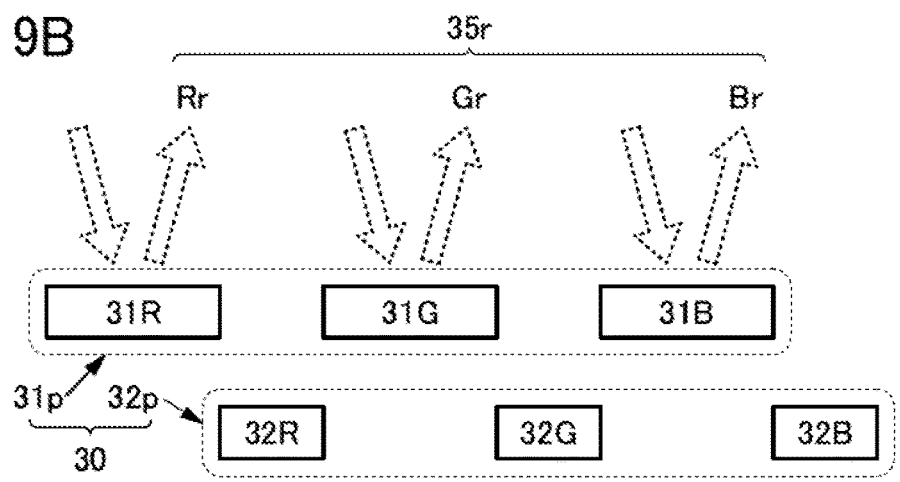
Figure 9C:
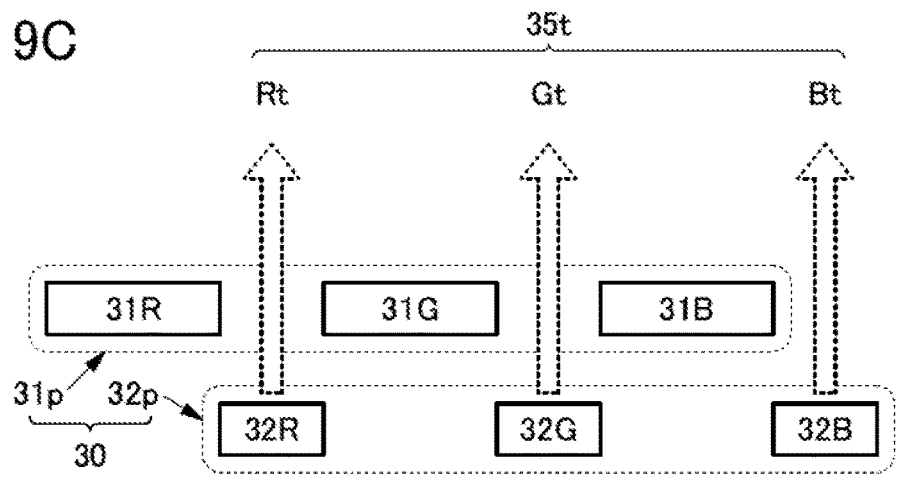

FIGS. 9A to 9C are schematic views illustrating structure examples of the pixel unit 30. The pixel unit 30 shown in FIGS. 9A to 9C includes the first pixel 31$p$ and the second pixel 32$p$.

The first pixel 31$p$ includes the display elements 31R, 31G, and 31B. The display elements 31R, 31G, and 31B are each an element that performs display by reflecting external light. The display element 31R reflects external light and emits red light Rr to the display surface side. Similarly, the display element 31G and the display element 31B emit green light Gr and blue light Br, respectively, to the display surface side.

The second pixel 32$p$ includes the display elements 32R, 32G, and 32B. The display elements 32R, 32G, and 32B are each a light-emitting element. The display element 32R emits red light Rt to the display surface side. Similarly, the display element 32G and the display element 32B emit green light Gt and blue light Bt, respectively, to the display surface side. Accordingly, a clear image can be displayed with low power consumption.

FIG. 9A corresponds to a mode (third display mode) in which display is performed by driving both the first pixel 31$p$ and the second pixel 32$p$. The pixel unit 30 can emit light 35$tr$ of a predetermined color to the display surface side by mixing six kinds of light, the light Rr, the light Gr, the light Br, the light Rt, the light Gt, and the light Bt.

Here, there are many combinations of luminance of the six kinds of light, the light Rr, the light Gr, the light Br, the light Rt, the light Gt, and the light Bt, where the light 35$tr$ has predetermined luminance and chromaticity. Thus, in one embodiment of the present invention, a combination where the luminance (a gray level) of the light Rr, the light Gr, and the light Br emitted from the first pixel 31p is the largest is preferably selected from the combinations of luminance (gray levels) of six kinds of light which provide the light 35tr with the same luminance and chromaticity. In that case, power consumption can be reduced without impairing color reproducibility.

FIG. 9B corresponds to a mode (first display mode) in which display is performed with only reflected light by driving the first pixel 31p. In the case where the illuminance of external light is sufficiently high, for example, the pixel unit 30 can emit light 35r of a predetermined color, which is a reflected light combination, to the display surface side by mixing only light from the first pixel 31p (the light Rr, the light Gr, and the light Br) without driving the second pixel 32p. This enables driving with extremely low power consumption. Furthermore, eye-friendly display can be performed.

FIG. 9C corresponds to a mode (second display mode) in which display is performed with only emitted light (transmitted light) by driving the second pixel 32p. In the case where the illuminance of external light is extremely low, for example, the pixel unit 30 can emit the light 35t of a predetermined color to the display surface side by mixing only light from the second pixel 32p (the light Rt, the light Gt, and the light Bt) without driving the first pixel 31p. Accordingly, a clear image can be displayed. Furthermore, luminance is lowered when the illuminance of external light is low, which can prevent a user from feeling glare and reduce power consumption.

[Modification Examples]

Although the example in which the first pixel 31p and the second pixel 32p each include display elements for three colors of red (R), green (G), and blue (B) is described above, one embodiment of the present invention is not limited thereto. A structure example different from the above will be described below.

FIGS. 10A to 10C and FIGS. 11A to 11C each illustrate a structure example of the pixel unit 30. Although schematic views corresponding to a mode (third display mode) in which display is performed by driving both the first pixel 31p and the second pixel 32p are illustrated here, display can be performed using either the mode (first display mode) in which display is performed with only reflected light by driving the first pixel 31p or the mode (second display mode) in which display is performed with only emitted light (transmitted light) by driving the second pixel 32p, as in the above cases.

Figure 10A:
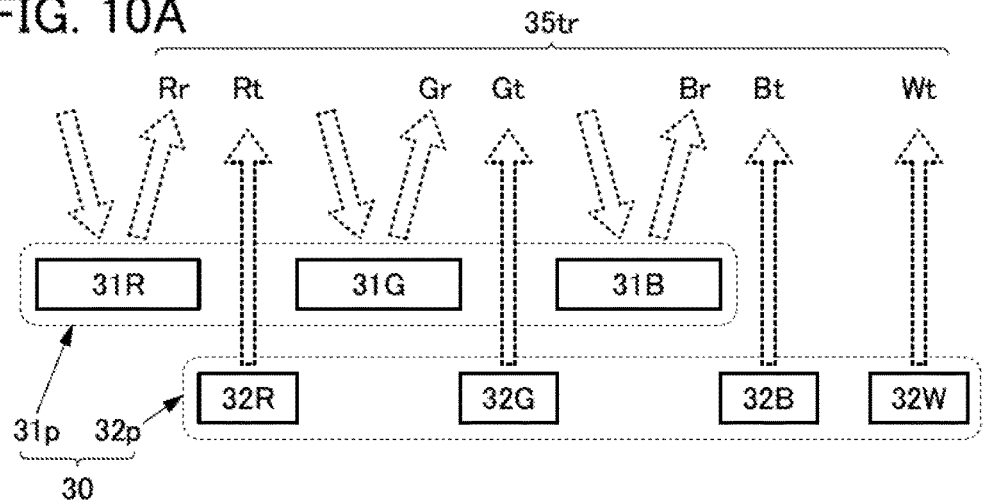
FIGS. 10A to 10C illustrate pixel units.

FIG. 10A illustrates an example in which the second pixel 32p includes a display element 32W that exhibits white (W) light in addition to the display element 32R, the display element 32G, and the display element 32B. This can reduce power consumption in the display modes each using the second pixel 32p (the second display mode and the third display mode).

Figure 10B:
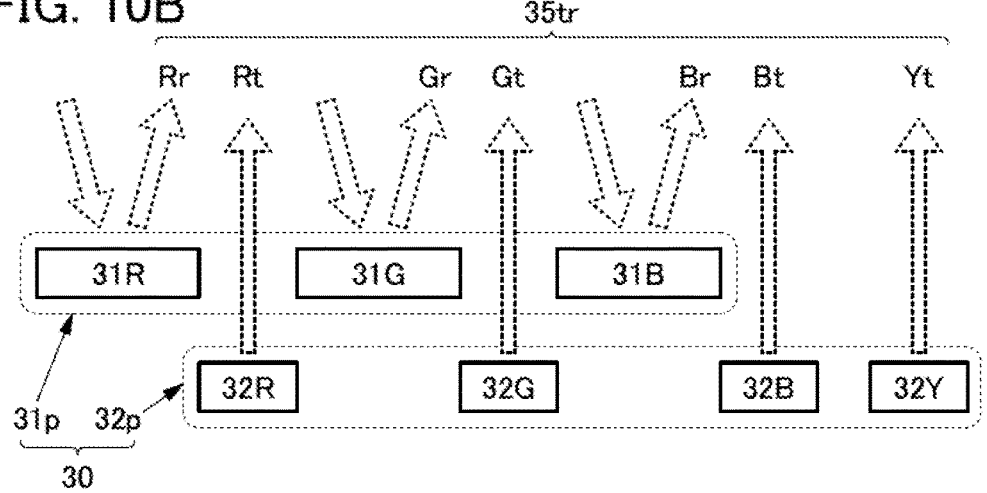

FIG. 10B illustrates an example in which the second pixel 32p includes a display element 32Y that exhibits yellow (Y) light in addition to the display element 32R, the display element 32G, and the display element 32B. This can reduce power consumption in the display modes using the second pixels 32p (the second display mode and the third display mode).

Figure 10C:
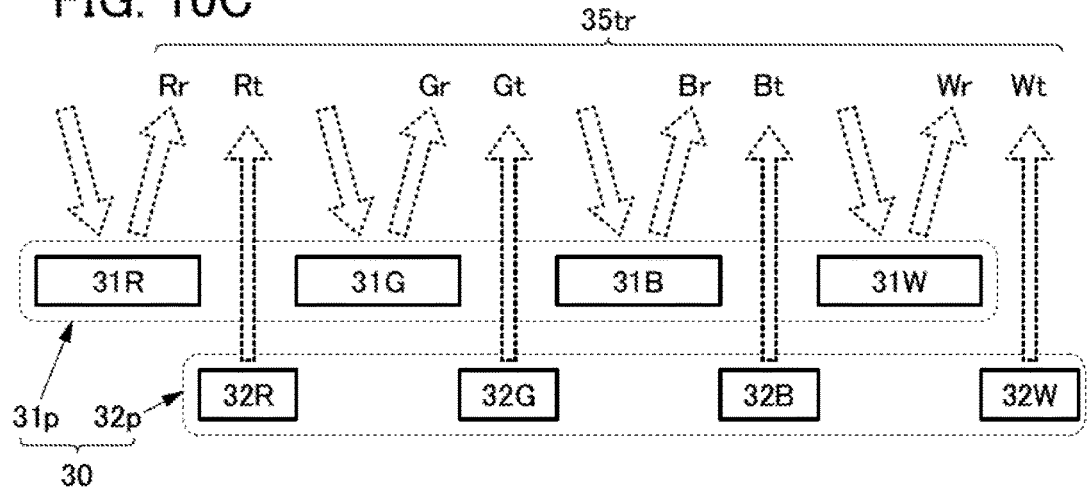

FIG. 10C illustrates an example in which the first pixel 31p includes a display element 31W that exhibits white (W) light in addition to the display element 31R, the display element 31G, and the display element 31B and the second pixel 32p includes the display element 32W that exhibits white (W) light in addition to the display element 32R, the display element 32G, and the display element 32B. This can reduce power consumption in the display modes each using the first pixel 31p (the first display mode and the third display mode) and in the display modes each using the second pixel 32p (the second display mode and the third display mode).

Figure 11A:
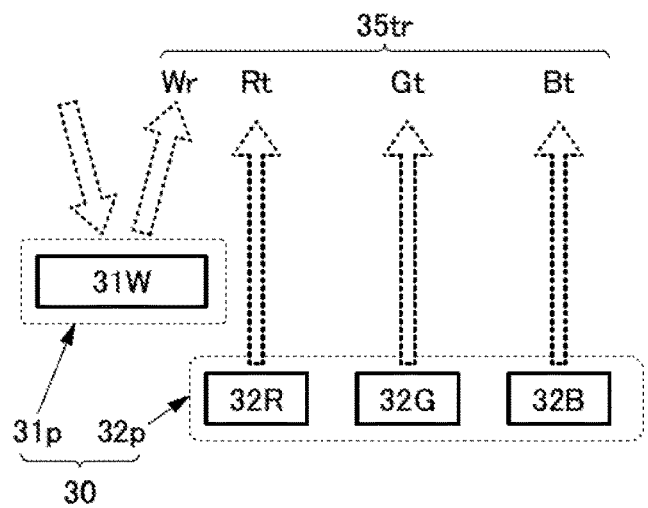
FIGS. 11A to 11C illustrate pixel units.

FIG. 11A illustrates an example in which the first pixel 31p includes only the display element 31W that exhibits white light. In this case, in the display mode using only the first pixel 31p (first display mode), monochrome or grayscale images can be displayed, and in the display modes each using the second pixel 32p (the second mode and the third display mode), color images can be displayed.

Furthermore, such a structure can increase the aperture ratio and the reflectivity of the first pixel 31p, allowing a brighter image to be displayed.

Figure 11B:
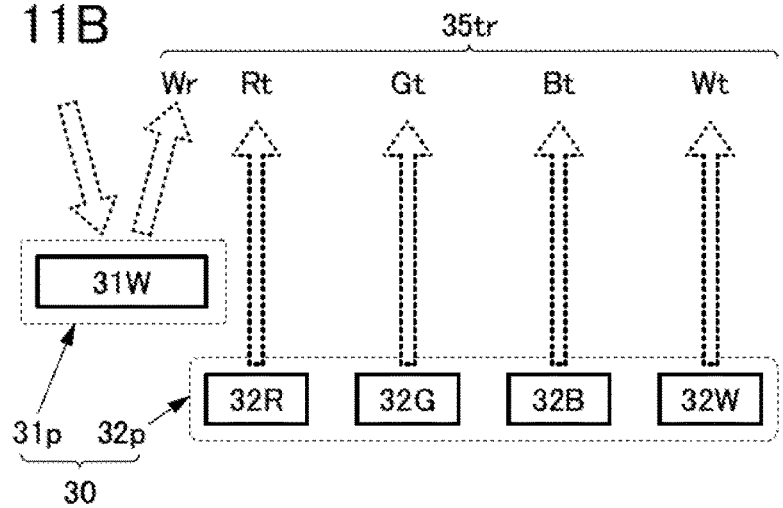

FIG. 11B illustrates an example in which the display element 32W that exhibits white (W) light is also included in the structure of FIG. 11A. This can reduce power consumption in the display modes each using the second pixel 32p (the second display mode and the third display mode).

Figure 11C:
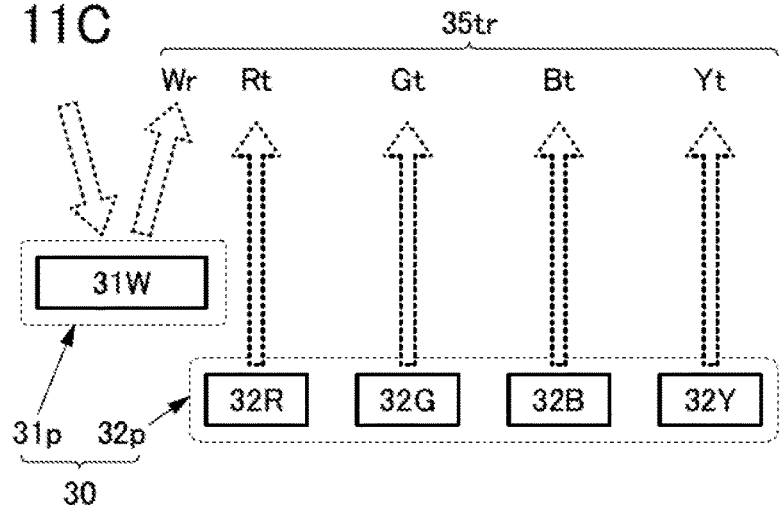

FIG. 11C illustrates an example in which the display element 32Y that exhibits yellow (Y) light is also included in the structure of FIG. 11A. This can reduce power consumption in the display modes each using the second pixel 32p (the second display mode and the third display mode).

The above is the description of the structure examples of display units.

[Cross-Sectional Structure Example of Display Portion]

Figure 12:
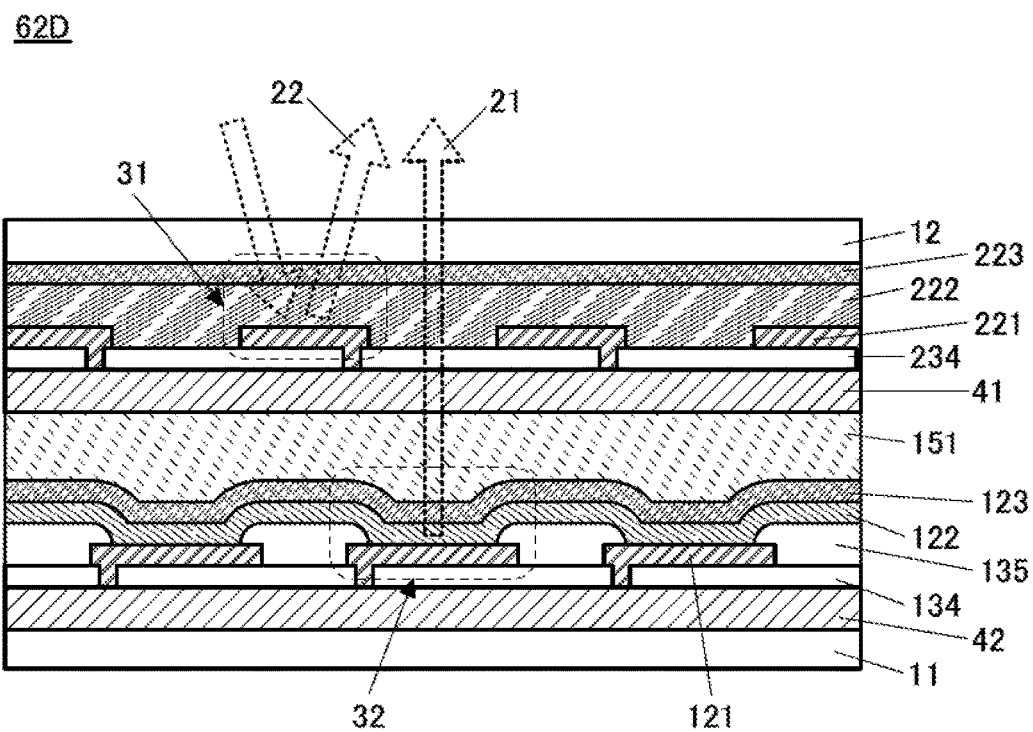
FIG. 12 shows a structure example of a display device.

FIG. 12 illustrates an example of a cross-sectional structure of the display portion 62D of the display device 62.

The display device 62 includes, between a substrate 11 and a substrate 12, a first layer 41, an insulating layer 134, an insulating layer 135, a display element 32, an adhesive layer 151, a second layer 42, an insulating layer 234, a display element 31, and the like.

The display element 31 includes a conductive layer 221, a conductive layer 223, and liquid crystal 222 between the conductive layers 221 and 223. The conductive layer 221 reflects visible light, and the conductive layer 223 transmits visible light. Thus, the display element 31 is a reflective liquid crystal element that emits reflected light 22 to the substrate 12 side. Here, the conductive layer 221 is provided for each pixel to function as each pixel electrode. The conductive layer 223 is shared by a plurality of pixels. The conductive layer 223 is connected to a wiring supplied with a constant potential in a region that is not illustrated and functions as a common electrode.

The display element 32 includes a conductive layer 121, a conductive layer 123, and an EL layer 122 between the conductive layers 121 and 123. The EL layer 122 includes at least a light-emitting substance. The conductive layer 121 reflects visible light, and the conductive layer 123 transmits visible light. Thus, the display element 32 is an electroluminescent element that emits light 21 to the substrate 12 side by application of voltage between the conductive layers 121 and 123. Here, the conductive layer 121 is provided for each pixel and functions as each pixel electrode. The EL layer 122 and the conductive layer 123 are shared by a plurality of pixels. The conductive layer 123 is connected to a wiring supplied with a constant potential in a region that is not illustrated and functions as a common electrode.

The first layer 41 includes a circuit that drives the display element 31. The second layer 42 includes a circuit that drives the display element 32. For example, the first layer 41 and the second layer 42 each include a pixel circuit including a transistor, a capacitor, a wiring, and an electrode.

The insulating layer 234 is provided between the first layer 41 and the conductive layer 221. The conductive layer 221 and the first layer 41 are electrically connected to each other through an opening formed in the insulating layer 234, whereby the first layer 41 and the display element 31 are electrically connected to each other.

The insulating layer 134 is provided between the second layer 42 and the conductive layer 121. The conductive layer 121 and the second layer 42 are electrically connected to each other through an opening formed in the insulating layer 134, whereby the second layer 42 and the display element 32 are electrically connected to each other.

The first layer 41 and the conductive layer 123 are bonded to each other with the adhesive layer 151. The adhesive layer 151 also functions as a sealing layer that seals the display element 32.

In the case where the pixel circuit of the first layer 41 includes a transistor using an oxide semiconductor and thus having a significantly low off-state current or the case where the pixel circuit includes a memory element, for example, the gray level can be maintained even when writing operation to a pixel is stopped in displaying a still image using the display element 31. That is, display can be maintained even when the frame rate is set to an extremely small value. In one embodiment of the present invention, the conductive layer 123 for blocking noise is provided, so that a change in gray level of the display element 31 due to noise can be prevented. Thus, the frame rate can be extremely reduced while the display quality is maintained, and driving can be performed with low power consumption.

The above is the description of a cross-sectional structure example of the display portion.

At least part of this embodiment can be implemented in combination with any of the other embodiments described in this specification as appropriate.

(Embodiment 3)

In this embodiment, a basic structure of a display device of one embodiment of the present invention is described.

One embodiment of the display device 62 described in Embodiment 1 has a structure where a first display panel and a second display panel are bonded to each other with an adhesive layer therebetween. In the first display panel, first pixels that include reflective liquid crystal elements are provided. In the second display panel, second pixels that include light-emitting elements are provided. The reflective liquid crystal elements can produce gray levels by controlling the amount of reflected light. The light-emitting elements can produce gray levels by controlling the amount of light emission.

The display device can perform display by using only reflected light, display by using only light emitted from the light-emitting elements, and display by using both reflected light and light emitted from the light-emitting elements, for example.

The first display panel is provided on the viewing side. The second display panel is provided on the side opposite to the viewing side. The first display panel includes a first resin layer in a position closest to the adhesive layer. The second display panel includes a second resin layer in a position closest to the adhesive layer.

It is preferable that a third resin layer be provided on the display surface side of the first display panel and a fourth resin layer be provided on the rear surface side (the side opposite to the display surface side) of the second display panel. Thus, the display device can be extremely lightweight and less likely to be broken.

The first to fourth resin layers (hereinafter also collectively referred to as a resin layer) have a feature of being extremely thin. Specifically, it is preferable that each of the resin layers have a thickness of 0.1 µm or more and 3 µm or less. Thus, even a structure where the two display panels are stacked can have a small thickness. Furthermore, light absorption due to the resin layer positioned in the path of light emitted from the light-emitting element in the second pixel can be reduced, so that light can be extracted with higher efficiency and the power consumption can be reduced.

The resin layer can be formed in the following manner, for example. A thermosetting resin material with a low viscosity is applied to a support substrate and cured by heat treatment to form the resin layer. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, it is preferable to perform the irradiation by scanning using linear laser light. By the method, the process time of the case of using a large support substrate can be shortened. As the laser light, excimer laser light with a wavelength of 308 nm can be suitably used.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is formed using a photosensitive resin material can be processed by light exposure and development treatment. For example, an opening portion can be formed and an unnecessary portion can be removed. Moreover, by optimizing a light exposure method or light exposure conditions, an uneven shape can be formed in a surface of the resin layer. For example, an exposure technique using a half-tone mask or a gray-tone mask or a multiple exposure technique may be used.

Note that a non-photosensitive resin material may be used. In that case, a method of forming an opening portion or an uneven shape using a resist mask or a hard mask that is formed over the resin layer can be used.

In this case, part of the resin layer that is positioned in the path of light emitted from the light-emitting element is preferably removed. That is, an opening portion overlapping with the light-emitting element is provided in the first resin layer and the second resin layer. Thus, a reduction in color reproducibility and light extraction efficiency that is caused by absorption of part of light emitted from the light-emitting element by the resin layer can be inhibited.

Alternatively, the resin layer may be provided with a concave portion so that a portion of the resin layer that is positioned in the path of light emitted from the light-emitting element is thinner than the other portion. That is, the resin layer may have a structure where two portions with different thicknesses are included and the portion with a smaller thickness overlaps with the light-emitting element.

The resin layer that has the structure can also reduce absorption of light emitted from the light-emitting element.

In the case where the first display panel includes the third resin layer, an opening portion overlapping with the light-emitting element is preferably provided in a manner similar to that described above. Thus, color reproducibility and light extraction efficiency can be further increased.

In the case where the first display panel includes the third resin layer, part of the third resin layer that is positioned in the path of light of the reflective liquid crystal element is preferably removed. That is, an opening portion overlapping with the reflective liquid crystal element is provided in the third resin layer. This can increase the reflectivity of the reflective liquid crystal element.

In the case where the opening portion is formed in the resin layer, a light absorption layer is formed over the support substrate, the resin layer having the opening portion is formed over the light absorption layer, and a light-transmitting layer covering the opening portion is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

As another example, the following method can be used. That is, a thin part is formed in a portion where the opening portion of the resin layer is to be formed, and the support substrate and the resin layer are separated from each other by the above-described method. Then, plasma treatment or the like is performed on a separated surface of the resin layer to reduce the thickness of the resin layer, whereby the opening portion can be formed in the thin part of the resin layer.

Each of the first pixel and the second pixel preferably includes a transistor. Furthermore, an oxide semiconductor is preferably used as a semiconductor where a channel of the transistor is formed. An oxide semiconductor can achieve high on-state current and high reliability even when the highest temperature in the manufacturing process of the transistor is reduced (e.g., 400° C. or lower, preferably 350° C. or lower). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using low-temperature polysilicon (LTPS), for example, processes such as a laser crystallization process, a baking process before crystallization, and a baking process for activating impurities are required, and the highest temperature in the manufacturing process of the transistor is higher than that in the case of using an oxide semiconductor (e.g., higher than or equal to 500° C., higher than or equal to 550° C., or higher than or equal to 600° C.), though high field-effect mobility can be obtained. Therefore, high heat resistance is required for the resin layer positioned on the surface side on which the transistor is formed. In addition, the thickness of the resin layer needs to be comparatively large (e.g., larger than or equal to 10 µm, or larger than or equal to 20 µm) because the resin layer is also irradiated with laser light in the laser crystallization process.

In contrast, in the case of using an oxide semiconductor, a special material having high heat resistance is not required for the resin layer, and the resin layer can be formed thin. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin layer with a low viscosity typified by a photosensitive polyimide and an oxide semiconductor with which a transistor having excellent electrical characteristics can be obtained even at a low temperature.

Next, a pixel structure is described. The first pixels and the second pixels are arranged in a matrix to form the display portion. In addition, the display device preferably includes a first driver portion for driving the first pixels and a second driver portion for driving the second pixels. It is preferable that the first driver portion be provided in the first display panel and the second driver portion be provided in the second display panel.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

The first pixel is preferably formed of one pixel that emits white (W) light, for example. The second pixel preferably includes subpixels that emit light of three colors of red (R), green (G), and blue (B), for example. In addition, a subpixel that emits white (W) light or yellow (Y) light may be included. By arranging such first pixels and second pixels with the same pitch, the area of the first pixels can be increased and the aperture ratio of the first pixels can be increased.

Note that the first pixel may include subpixels that emit light of three colors of red (R), green (G), and blue (B), and may further include a subpixel that emits white (W) light or yellow (Y) light.

Next, transistors that can be used in the first display panel and the second display panel are described. A transistor provided in the first pixel of the first display panel and a transistor provided in the second pixel of the second display panel may have either the same structure or different structures.

As a structure of the transistor, a bottom-gate structure is given, for example. A transistor having a bottom-gate structure includes a gate electrode below a semiconductor layer (on the formation surface side). A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer (on the side opposite to the formation surface side). A first source electrode and a first drain electrode are provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

A more specific example of the display device of one embodiment of the present invention is described below with reference to drawings.

[Structure Example 1]

Figure 13:
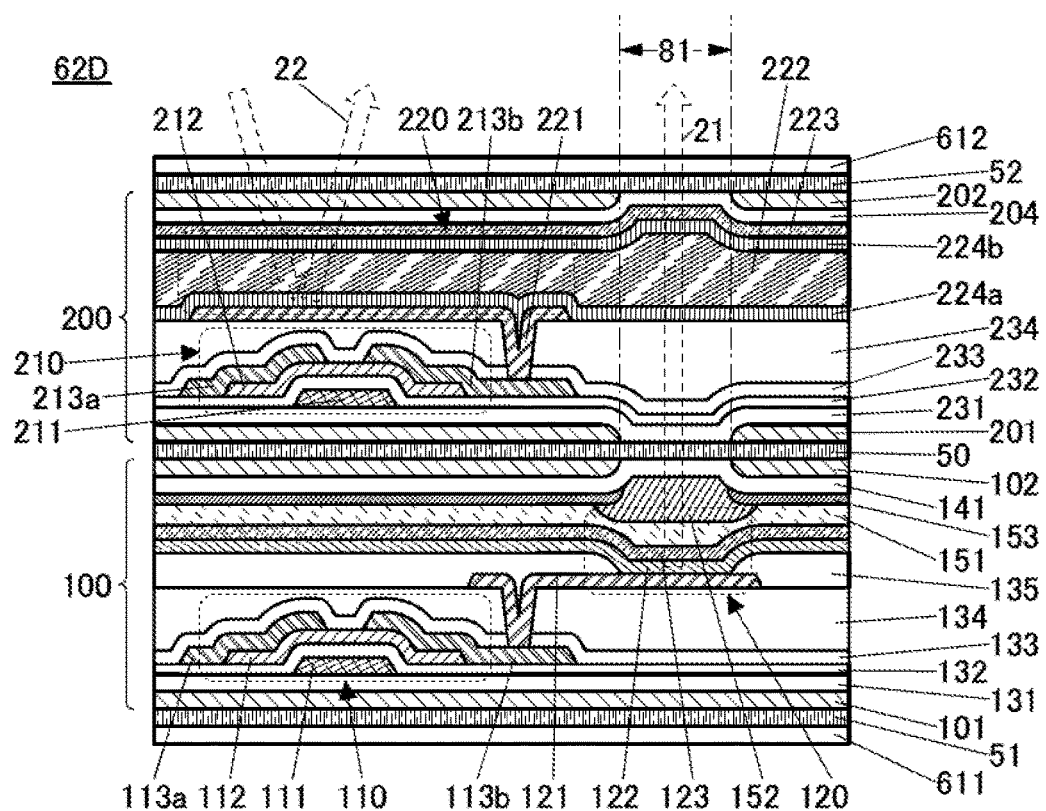
FIG. 13 illustrates a structure of a display device.

FIG. 13 is a schematic cross-sectional view of the display portion 62D in the display device 62 shown in FIG. 8. In the display device 62, a display panel 100 and a display panel 200 are bonded to each other using an adhesive layer 50. The display device 62 includes a substrate 611 on the rear side (the side opposite to the viewing side) and a substrate 612 on the front side (the viewing side).

The display panel 100 includes a transistor 110 and a light-emitting element 120 between a resin layer 101 and a resin layer 102. The display panel 200 includes a transistor 210 and a liquid crystal element 220 between a resin layer 201 and a resin layer 202. The resin layer 101 is bonded to the substrate 611 with an adhesive layer 51 positioned therebetween. The resin layer 202 is bonded to the substrate 612 with an adhesive layer 52 positioned therebetween.

The resin layer 102, the resin layer 201, and the resin layer 202 are each provided with an opening portion. A region 81 shown in FIG. 13 is a region overlapping with the light-emitting element 120 and overlapping with the opening portion of the resin layer 102, the opening portion of the resin layer 201, and the opening portion of the resin layer 202.

[Display Panel 100]

The resin layer 101 is provided with the transistor 110, the light-emitting element 120, an insulating layer 131, an insulating layer 132, an insulating layer 133, the insulating layer 134, the insulating layer 135, and the like. The resin layer 102 is provided with a light-blocking layer 153, a coloring layer 152, and the like. The resin layer 101 and the resin layer 102 are bonded to each other using the adhesive layer 151.

The transistor 110 is provided over the insulating layer 131 and includes a conductive layer 111 serving as a gate electrode, part of the insulating layer 132 serving as a gate insulating layer, a semiconductor layer 112, a conductive layer 113a serving as one of a source electrode and a drain electrode, and a conductive layer 113b serving as the other of the source electrode and the drain electrode.

The semiconductor layer 112 preferably includes an oxide semiconductor.

The insulating layer 133 and the insulating layer 134 cover the transistor 110. The insulating layer 134 serves as a planarization layer.

The light-emitting element 120 includes the conductive layer 121, the EL layer 122, and the conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side.

The conductive layer 121 is electrically connected to the conductive layer 113b through an opening provided in the insulating layer 134 and the insulating layer 133. The insulating layer 135 covers an end portion of the conductive layer 121 and is provided with an opening to expose a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120. The light-blocking layer 153 includes an opening in a portion overlapping with the light-emitting element 120.

The insulating layer 141 covers the opening portion of the resin layer 102. A portion of the insulating layer 141 that overlaps with the opening portion of the resin layer 102 is in contact with the adhesive layer 50.

[Display Panel 200]

The resin layer 201 is provided with the transistor 210, the conductive layer 221, an alignment film 224a, an insulating layer 231, an insulating layer 232, an insulating layer 233, an insulating layer 234, and the like. The resin layer 202 is provided with an insulating layer 204, a conductive layer 223, an alignment film 224b, and the like. Liquid crystal 222 is sandwiched between the alignment film 224a and the alignment film 224b. The resin layer 201 and the resin layer 202 are bonded to each other using an adhesive layer in a region not shown.

The transistor 210 is provided over the insulating layer 231 and includes a conductive layer 211 serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode.

The semiconductor layer 212 preferably includes an oxide semiconductor.

The insulating layer 233 and the insulating layer 234 cover the transistor 210. The insulating layer 234 serves as a planarization layer.

The liquid crystal element 220 includes the conductive layer 221, the conductive layer 223, and the liquid crystal 222 positioned therebetween. The conductive layer 221 has a function of reflecting visible light, and the conductive layer 223 has a function of transmitting visible light. Therefore, the liquid crystal element 220 is a reflective liquid crystal element.

The conductive layer 221 is electrically connected to the conductive layer 213b through an opening provided in the insulating layer 234 and the insulating layer 233. The alignment film 224a covers surfaces of the conductive layer 221 and the insulating layer 234.

The conductive layer 223 and the alignment film 224b are stacked on the resin layer 201 side of the resin layer 202. Note that the insulating layer 204 is provided between the resin layer 202 and the conductive layer 223. In addition, a coloring layer for coloring light reflected by the liquid crystal element 220 may be provided.

The insulating layer 231 covers the opening portion of the resin layer 201. A portion of the insulating layer 231 that overlaps with the opening portion of the resin layer 202 is in contact with the adhesive layer 50. The insulating layer 204 covers the opening portion of the resin layer 202. A portion of the insulating layer 204 that overlaps with the opening portion of the resin layer 202 is in contact with the adhesive layer 52.

[Display Device 62]

The display device 62 includes a portion where the light-emitting element 120 does not overlap with the reflective liquid crystal element 220 when the display portion 62D is seen from above. Thus, the light 21 that is colored by the coloring layer 152 is emitted from the light-emitting element 120 to the viewing side as shown in FIG. 13. Furthermore, the reflected light 22 that is external light reflected by the conductive layer 221 is emitted through the liquid crystal 222 of the liquid crystal element 220.

The light 21 emitted from the light-emitting element 120 is emitted to the viewing side through the opening portion of the resin layer 102, the opening portion of the resin layer 201, and the opening portion of the resin layer 202. Since the resin layer 102, the resin layer 201, and the resin layer 202 are not provided in the path of the light 21, even in the case where the resin layer 102, the resin layer 201, and the resin layer 202 absorb part of visible light, high light extraction efficiency and high color reproducibility can be obtained.

Note that the substrate 612 serves as a polarizing plate or a circular polarizing plate. A polarizing plate or a circular polarizing plate may be located outward from the substrate 612.

In the above-described structure of the display panel 200, a coloring layer is not included and color display is not performed, but a coloring layer may be provided on the resin layer 202 side to perform color display.

The above is the description of the structure example.

[Modification Example of Structure Example]

A structure example that is partly different from the structure example shown in FIG. 13 is described below.

In FIG. 13, the opening portion is provided in a portion of the resin layer that is positioned in the path of light emitted from the light-emitting element 120, but an opening portion may be provided also in a portion of the resin layer that is positioned in the path of light of the reflective liquid crystal element 220.

Figure 14:
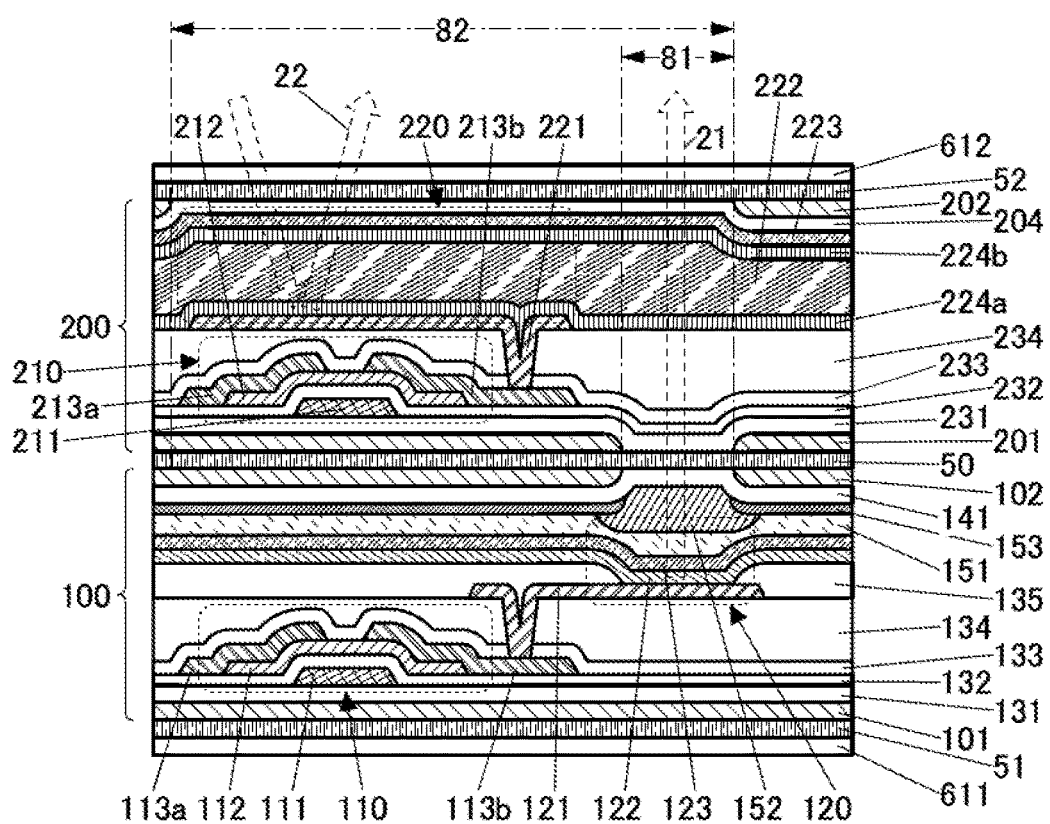
FIG. 14 illustrates a structure of a display device.

FIG. 14 shows an example where a region 82 is included in addition to the region 81. The region 82 overlaps with the opening portion of the resin layer 202 and the liquid crystal element 220.

In the example shown in FIG. 14, the resin layer 202 is provided with one opening in which an opening portion overlapping with the light-emitting element 120 and an opening portion overlapping with the liquid crystal element 220 are included. Alternatively, the opening portion overlapping with the light-emitting element 120 and the opening portion overlapping with the liquid crystal element 220 may be separately provided.

[Transistor]

The display device 62 exemplified in FIG. 13 shows an example of using bottom-gate transistors as the transistor 110 and the transistor 210.

In the transistor 110, the conductive layer 111 serving as a gate electrode is in a position closer to the formation surface (the resin layer 101 side) than the semiconductor layer 112. The insulating layer 132 covers the conductive layer 111. The semiconductor layer 112 covers the conductive layer 111. A region of the semiconductor layer 112 that overlaps with the conductive layer 111 corresponds to a channel formation region. The conductive layer 113*a* and the conductive layer 113*b* are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is positioned between the conductive layer 111 and each of the conductive layer 113*a* and the conductive layer 113*b*. Thus, the parasitic capacitance between the conductive layer 111 and each of the conductive layer 113*a* and the conductive layer 113*b* can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 is described.

Figure 15A:
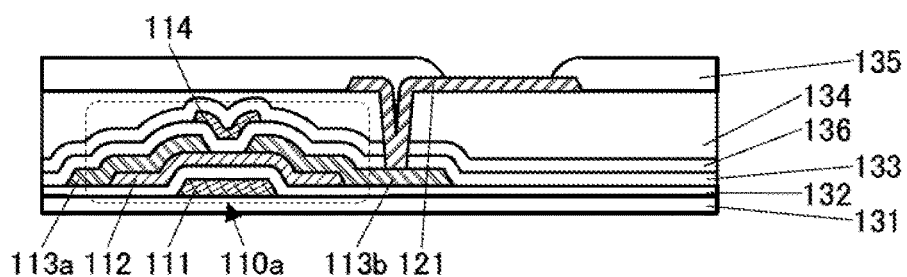
FIGS. 15A to 15C illustrate structures of display devices.

A transistor 110*a* shown in FIG. 15A is different from the transistor 110 in that the transistor 110*a* includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is positioned to face the conductive layer 111 with the semiconductor layer 112 therebetween. In the case where the conductive layer 111 is used as a first gate electrode, the conductive layer 114 can serve as a second gate electrode. By supplying the same potential to the conductive layer 111 and the conductive layer 114, the on-state current of the transistor 110*a* can be increased. By supplying a potential for controlling the threshold voltage to one of the conductive layer 111 and the conductive layer 114 and a potential for driving to the other, the threshold voltage of the transistor 110*a* can be controlled.

A conductive material including an oxide is preferably used as the conductive layer 114. In that case, a conductive film to be the conductive layer 114 is formed in an atmosphere containing oxygen, whereby oxygen can be supplied to the insulating layer 133. The proportion of an oxygen gas in a film formation gas in a sputtering method is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, e.g., a silicon nitride film. Hydrogen is supplied to the conductive layer 114 during the formation of the insulating layer 136 or by heat treatment to be performed after that, whereby the electrical resistance of the conductive layer 114 can be reduced effectively.

Figure 15B:
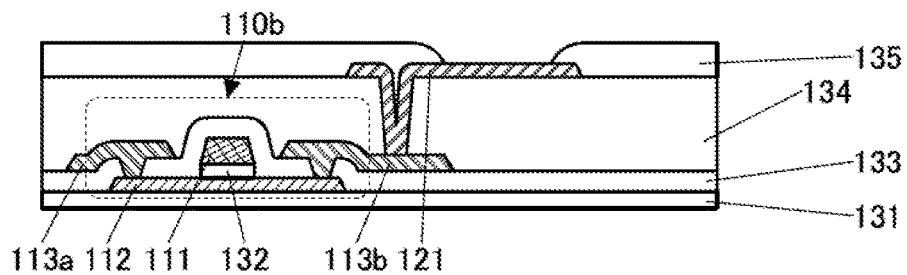

A transistor 110*b* shown in FIG. 15B is a top-gate transistor.

In the transistor 110*b*, the conductive layer 111 serving as a gate electrode is provided over the semiconductor layer 112 (provided on the side opposite to the formation surface side). The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layer 113*a* and the conductive layer 113*b* are provided over the insulating layer 133. The conductive layer 113*a* and the conductive layer 113*b* are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or the conductive layer 113b can be easily increased, so that the parasitic capacitance therebetween can be reduced.

Figure 15C:
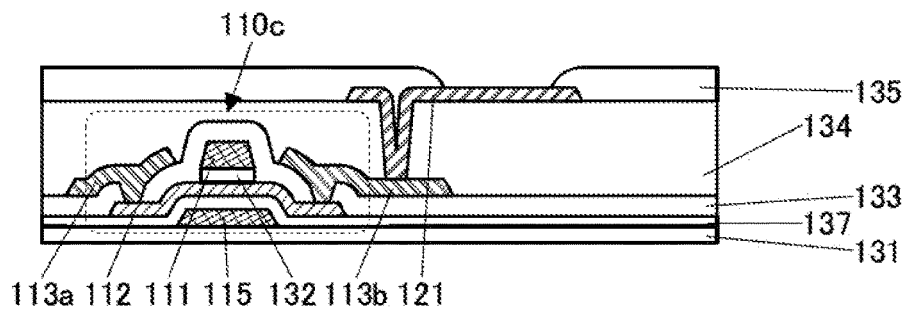

A transistor 110c shown in FIG. 15C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 serves as a second gate electrode like the conductive layer 114. Thus, the on-state current can be increased and the threshold voltage can be controlled, for example.

In the display device 62, the transistor included in the display panel 100 and the transistor included in the display panel 200 may be different from each other. For example, the transistor 110a or the transistor 110c can be used as the transistor that is electrically connected to the light-emitting element 120 because a comparatively large amount of current needs to be fed to the transistor, and the transistor 110 can be used as the other transistor to reduce the occupation area of the transistor.

Figure 16:
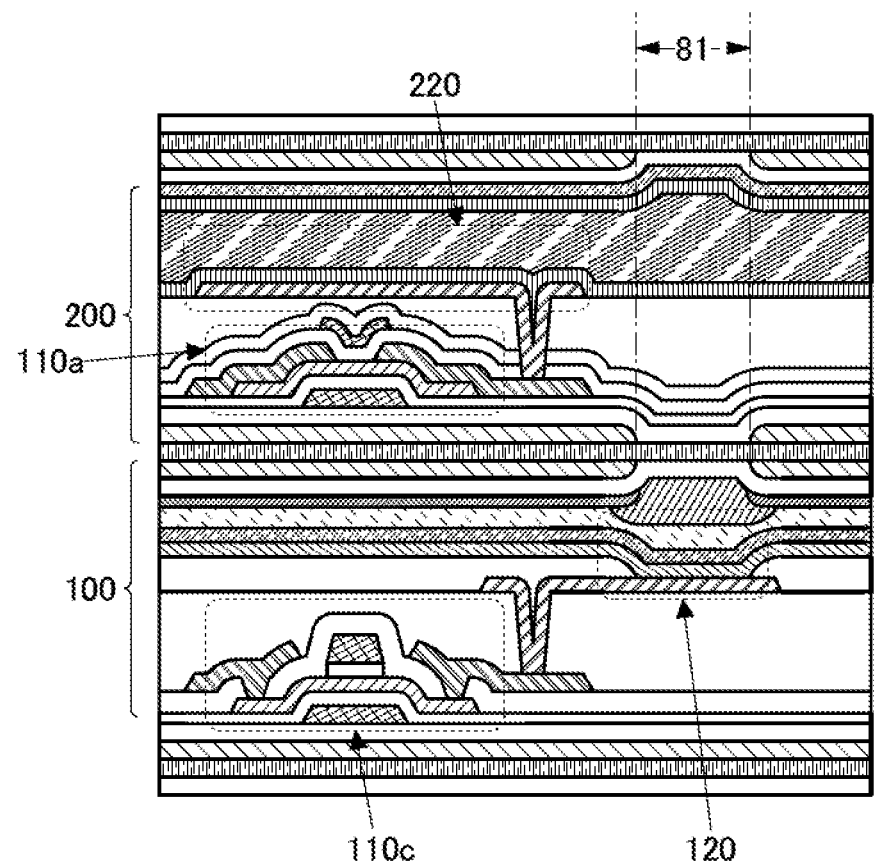
FIG. 16 illustrates a structure of a display device.

FIG. 16 shows an example of the case where the transistor 110a is used instead of the transistor 210 in FIG. 13 and the transistor 110c is used instead of the transistor 110 in FIG. 13.

The above is the description of the transistor.

At least part of this embodiment can be implemented in combination with any of the other embodiments described in this specification as appropriate.

(Embodiment 4)

In this embodiment, a specific example of a display device of one embodiment of the present invention will be described. A display device 400 described below includes both a reflective liquid crystal element and a light-emitting element that can be used in the display device 62 described in Embodiment 1 and can perform display in a transmission mode and in a reflection mode.

[Structure Example]

FIG. 17A is a block diagram illustrating an example of the structure of a display device 400. The display device 400 includes a plurality of pixels 410 that are arranged in a matrix in a display portion 362a. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes the plurality of pixels 410 arranged in a direction C, and a plurality of wirings S1 and a plurality of wirings S2, which are electrically connected to the circuit SD.

Although the configuration including one circuit GD and one circuit SD is illustrated here for simplicity, the circuit GD and the circuit SD for driving the liquid crystal element and those for driving the light-emitting element may be provided separately.

The pixel 410 includes a reflective liquid crystal element and a light-emitting element. In the pixel 410, the liquid crystal element and the light-emitting element partly overlap with each other.

FIG. 17B1 illustrates a structure example of an electrode 311b included in the pixel 410. The electrode 311b serves as a reflective electrode of the liquid crystal element in the pixel 410. The electrode 311b includes an opening 451.

In FIG. 17B1, a light-emitting element 360 in a region overlapping with the electrode 311b is shown by a dashed line. The light-emitting element 360 overlaps with the opening 451 included in the electrode 311b. Thus, light from the light-emitting element 360 is emitted to the display surface side through the opening 451.

In FIG. 17B1, the pixels 410 adjacent in the direction R correspond to different emission colors. As illustrated in FIG. 17B1, the openings 451 are preferably provided in different positions in the electrodes 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 17B2 may be employed.

If the ratio of the total area of the opening 451 to the total area except for the opening portion is too large, display performed using the liquid crystal element is dark. If the ratio of the total area of the opening 451 to the total area except for the opening portion is too small, display performed using the light-emitting element 360 is dark.

If the area of the opening 451 in the electrode 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

[Circuit Configuration Example]

Figure 18:
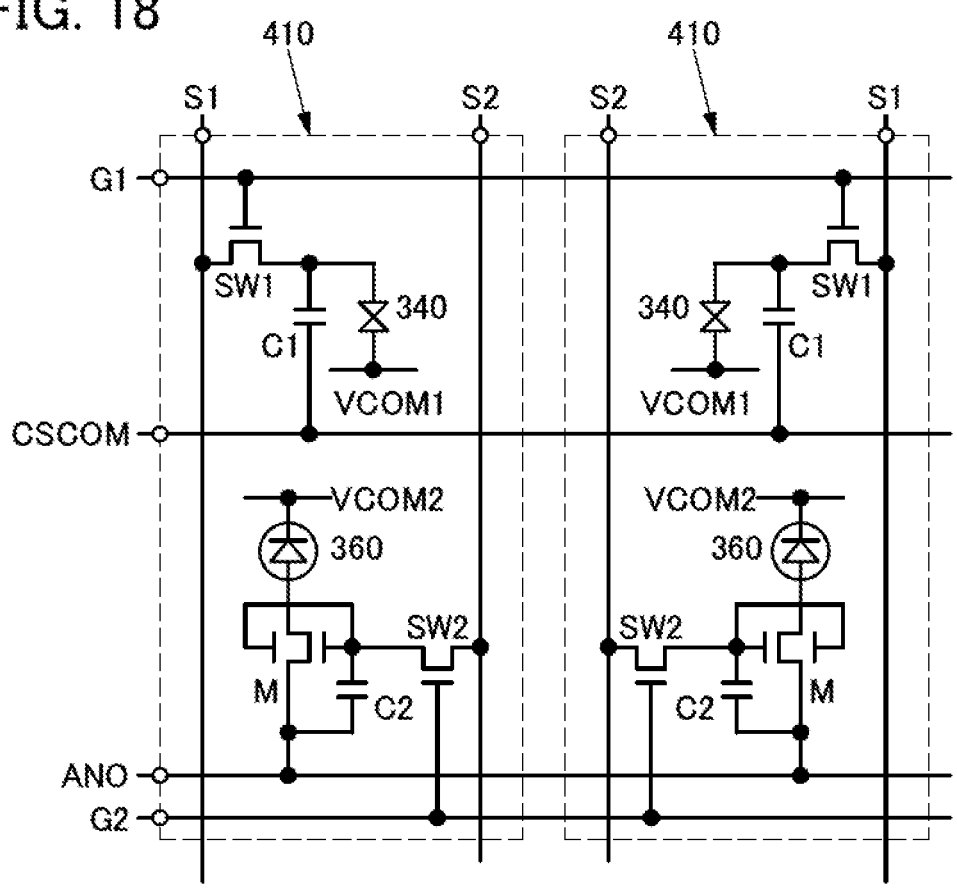
FIG. 18 illustrates a circuit of a display device.

FIG. 18 is a circuit diagram illustrating a configuration example of the pixel 410. FIG. 18 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 18 also illustrates a wiring VCOM1 electrically connected to the liquid crystal element 340 and a wiring VCOM2 electrically connected to the light-emitting element 360.

FIG. 18 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 18 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 18, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

[Structure Example of Display Device]

Figure 19:
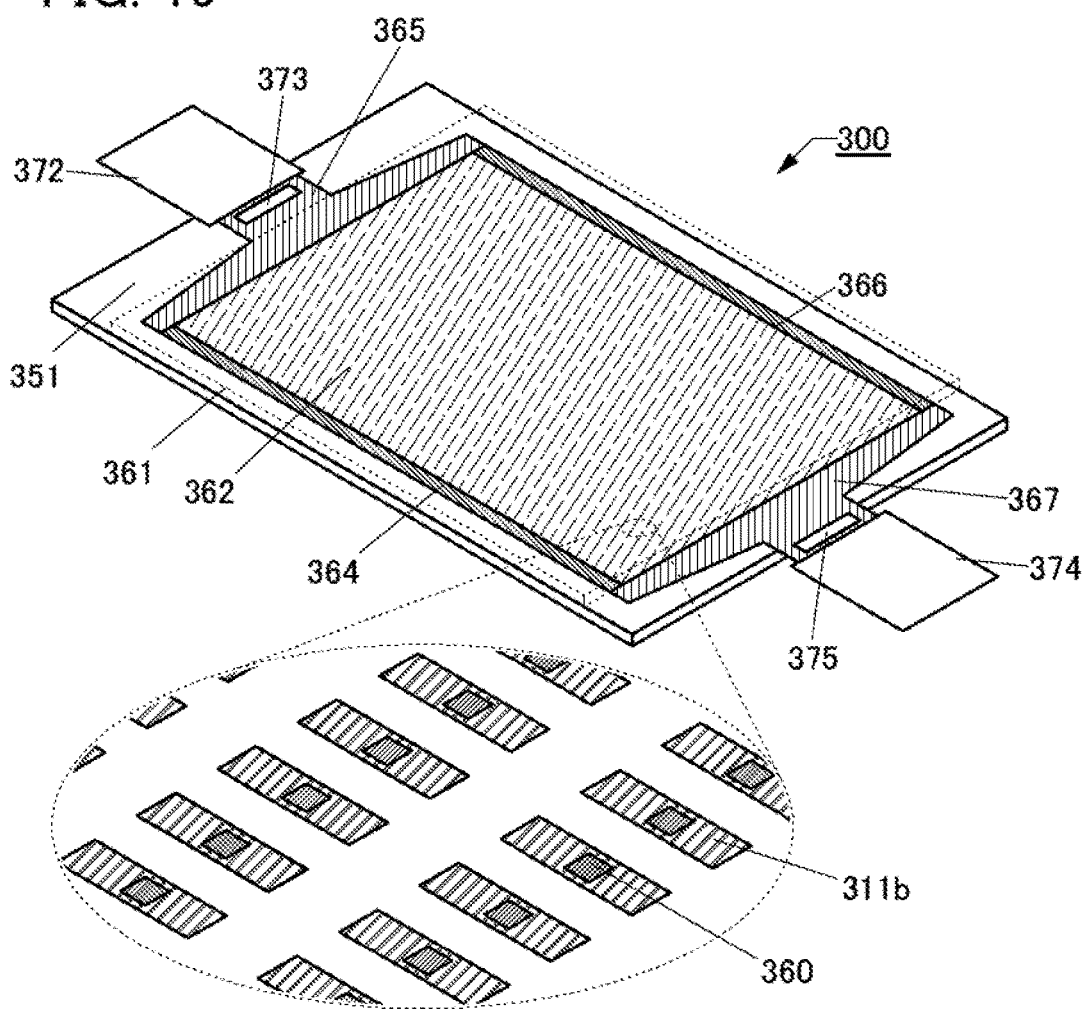
FIG. 19 illustrates a structure of a display device.

FIG. 19 is a schematic perspective view illustrating a display device 300 of one embodiment of the present invention. In the display device 300, a substrate 351 and a substrate 361 are attached to each other. In FIG. 19, the substrate 361 is shown by a dashed line.

The display device 300 includes a display portion 362, a circuit portion 364, a wiring 365, a circuit portion 366, a wiring 367, and the like. The substrate 351 is provided with the circuit portion 364, the wiring 365, the circuit portion 366, the wiring 367, the electrode 311b functioning as a pixel electrode, and the like. In FIG. 19, an IC 373, an FPC 372, an IC 375, and an FPC 374 are mounted on the substrate 351. Thus, the structure illustrated in FIG. 19 can be referred to as a display module including the display device 300, the IC 373, the FPC 372, the IC 375, and the FPC 374.

The display device 300 corresponds to the display device 62 described in Embodiment 1, and the display portion 362 corresponds to the display portion 62D.

For the circuit portion 364 and the circuit portion 366, a circuit functioning as a scan line driver circuit can be used, for example.

The wirings 365 and 367 each have a function of supplying signals and electric power to the display portion 362 and the circuit portion 364. The signals and electric power are input to the wiring 365 from the outside through the FPC 372 or from the IC 373.

FIG. 19 shows an example in which the ICs 373 and 375 are provided on the substrate 351 by a chip on glass (COG) method or the like. As the ICs 373 and 375, an IC functioning as a scan line driver circuit or the like can be used. Note that it is possible that the ICs 373 and 375 are not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPCs 372 and 374. Alternatively, the ICs 373 and 375 may be mounted on the FPCs 372 and 374 by a chip on film (COF) method or the like.

FIG. 19 is an enlarged view of part of the display portion 362. Electrodes 311b included in a plurality of display elements are arranged in a matrix in the display portion 362. The electrode 311b has a function of reflecting visible light and serves as a reflective electrode of the liquid crystal element 340 described later.

As illustrated in FIG. 19, the electrode 311b has an opening. The light-emitting element 360 is positioned closer to the substrate 351 than the electrode 311b is. Light is emitted from the light-emitting element 360 to the substrate 361 side through the opening in the electrode 311b.

[Cross-sectional Structure Examples]

Figure 20:
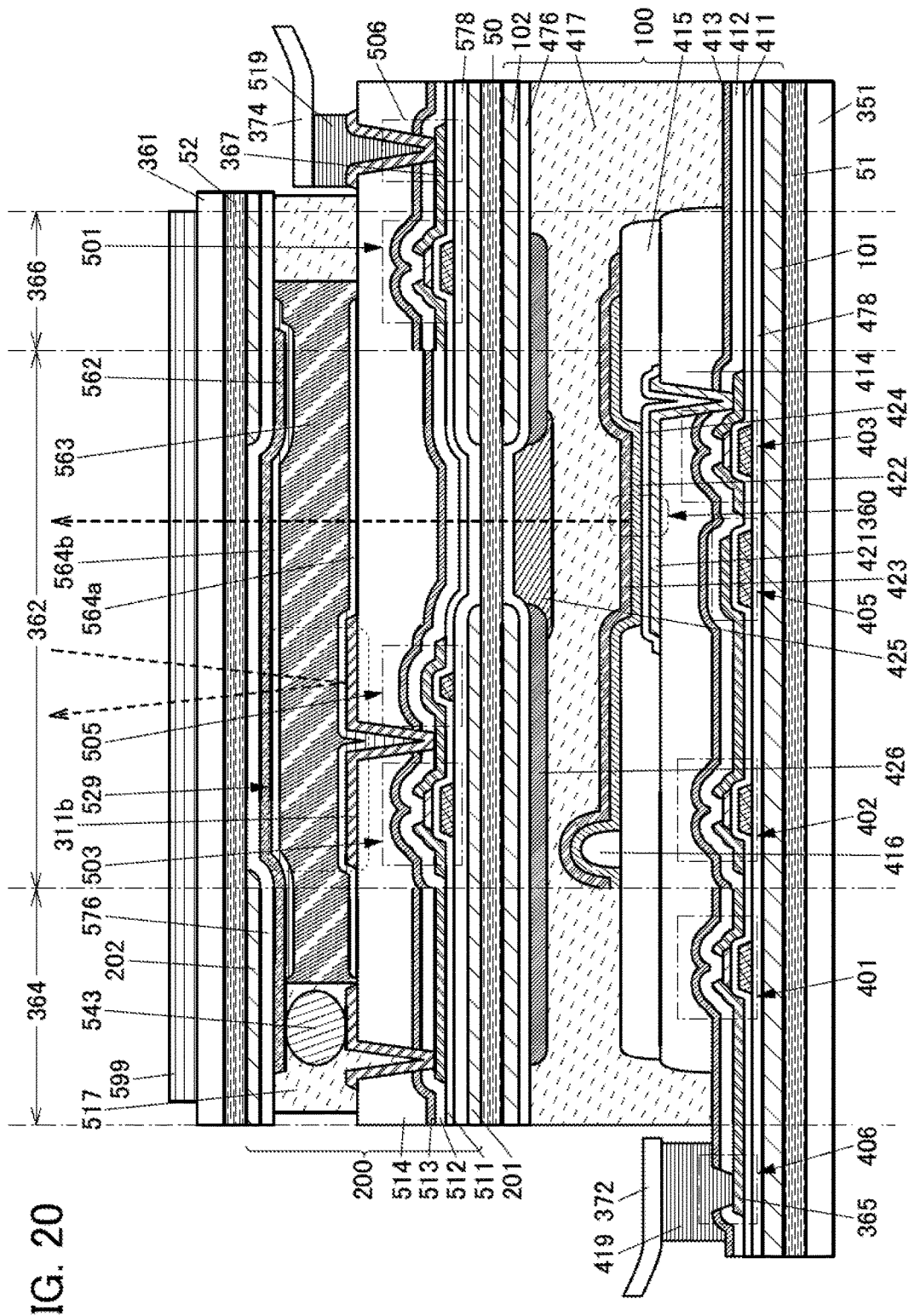
FIG. 20 illustrates a structure of a display device.

FIG. 20 illustrates an example of cross sections of part of a region including the FPC 372, part of a region including the circuit portion 364, part of a region including the display portion 362, part of a region including the circuit portion 366, and part of a region including the FPC 374 of the display device 300 illustrated in FIG. 19.

The display device illustrated in FIG. 20 includes a structure in which the display panels 100 and 200 are stacked. The display panel 100 includes the resin layers 101 and 102. The display panel 200 includes the resin layers 201 and 202. The resin layers 102 and 201 are bonded to each other with the adhesive layer 50. The resin layer 101 is bonded to the substrate 351 with the adhesive layer 51. The resin layer 202 is bonded to the substrate 361 with the adhesive layer 52.

[Display Panel 100]

The display panel 100 includes the resin layer 101, an insulating layer 478, a plurality of transistors, a capacitor 405, a wiring 407, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 102.

The resin layer 102 has an opening portion in a region overlapping with the light-emitting element 360.

The circuit portion 364 includes a transistor 401. The display portion 362 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 20 have bottom-gate structures. The transistor structures may be different between the circuit portion 364 and the display portion 362. The circuit portion 364 and the display portion 362 may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferred that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 20. Since an insulating layer formed using an organic material is not positioned at the end portion of the display device in the structure of FIG. 20, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top-emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362 can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The EL layer 422 contains a light-emitting substance.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 20 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 20, the spacer 416 may be provided on the substrate 361 side (e.g., in a position closer to the substrate 361 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 101. The insulating layer 476 is formed on a surface of the resin layer 102. The insulating layer 476 and the insulating layer 478 are preferably highly resistant to moisture. The light-emitting element 360, the transistors, and the like are preferably provided between a pair of insulating layers which are highly resistant to moisture, in which case impurities such as water can be prevented from entering these elements, leading an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside is transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the display panel 100.

[Display Panel 200]

The display panel 200 is a reflective liquid crystal display device employing a vertical electric field mode.

The display panel 200 includes the resin layer 201, an insulating layer 578, a plurality of transistors, a capacitor 505, a wiring 367, an insulating layer 511, an insulating layer 512, an insulating layer 513, an insulating layer 514, a liquid crystal element 529, an alignment film 564a, an alignment film 564b, an adhesive layer 517, an insulating layer 576, and the resin layer 202.

The resin layers 201 and 202 are bonded to each other with the adhesive layer 517. Liquid crystal 563 is sealed in a region surrounded by the resin layer 201, the resin layer 202, and the adhesive layer 517. A polarizing plate 599 is positioned on an outer surface of the substrate 361.

Furthermore, an opening portion overlapping with the light-emitting element 360 is formed in the resin layer 201. An opening portion overlapping with the liquid crystal element 529 and the light-emitting element 360 is formed in the resin layer 202.

The liquid crystal element 529 includes the electrode 311b, an electrode 562, and the liquid crystal 563. The electrode 311b functions as a pixel electrode. The electrode 562 functions as a common electrode. Alignment of the liquid crystal 563 can be controlled with an electric field generated between the electrode 311b and the electrode 562. The alignment film 564a is provided between the liquid crystal 563 and the electrode 311b. The alignment film 564b is provided between the liquid crystal 563 and the electrode 562.

The resin layer 202 is provided with the insulating layer 576, the electrode 562, the alignment film 564b, and the like.

The resin layer 201 is provided with the electrode 311b, the alignment film 564a, the transistor 501, the transistor 503, the capacitor 505, the connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as the source or the drain of the transistor 503 which is not electrically connected to the electrode 311b may function as part of a signal line. The conductive layer functioning as the gate of the transistor 503 may function as part of a scan line.

FIG. 20 illustrates a structure without a coloring layer as an example of the display portion 362. Thus, the liquid crystal element 529 is an element that performs monochrome display.

FIG. 20 illustrates an example of the circuit portion 366 in which the transistor 501 is provided.

A material inhibiting diffusion of impurities such as water and hydrogen is preferably used for at least one of the insulating layers 512 and 513 which cover the transistors.

The electrode 311b is provided over the insulating layer 514. The electrode 311b is electrically connected to one of a source and a drain of the transistor 503 through an opening formed in the insulating layer 514, the insulating layer 513, the insulating layer 512, and the like. The electrode 311b is electrically connected to one electrode of the capacitor 505.

Since the display panel 200 is a reflective liquid crystal display device, a conductive material that reflects visible light is used for the electrode 311b and a conductive material that transmits visible light is used for the electrode 562.

For example, a material containing one or more of indium (In), zinc (Zn), and tin (Sn) is preferably used as the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide, zinc oxide, and zinc oxide containing gallium are given, for example. Note that a film including graphene can be used as well. The film including graphene can be formed, for example, by reducing a film containing graphene oxide.

Examples of the conductive material that reflects visible light include aluminum, silver, and an alloy including any of these metal materials. A metal material such as gold, platinum, tungsten, chromium, molybdenum, iron, cobalt, copper, or palladium, or an alloy including any of these metal materials can also be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element 529 are controlled in accordance with the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the electrode 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 20, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through the connection layer 519. In the example of the structure illustrated in FIG. 20, the connection portion 506 is formed by stacking part of the wiring 367 and a conductive layer that is obtained by processing the same conductive film as the electrode 311b.

The above is the description of the display panel 200.

[Components]

The above components will be described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 400 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As a semiconductor material used for the transistors, an oxide semiconductor whose energy gap is greater than or equal to 2 eV, preferably greater than or equal to 2.5 eV, more preferably greater than or equal to 3 eV can be used. A typical example thereof is an oxide semiconductor containing indium, and for example, a CAC-OS described later or the like can be used.

A transistor with an oxide semiconductor having a larger band gap and a lower carrier density than silicon has a low off-state current and therefore can hold charges stored in a capacitor that is series-connected to the transistor for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to deposit a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

As an insulating material that can be used for the insulating layers, acrylic, epoxy, a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

[Display Element]

As a display element included in the first pixel located on the display surface side, an element which performs display by reflecting external light can be used. Such an element does not include a light source and thus power consumption in display can be significantly reduced. As the display element included in the first pixel, a reflective liquid crystal element can typically be used. Alternatively, as the first display element, an element using a microcapsule method, an electrophoretic method, an electrowetting method, an Electronic Liquid Powder (registered trademark) method, or the like can be used, other than a Micro Electro Mechanical Systems (MEMS) shutter element or an optical interference type MEMS element.

As a display element included in the second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), and a quantum-dot light-emitting diode (QLED) can be used. Alternatively, a combination of a backlight as a light source and a transmissive liquid crystal element which controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, or an antiferroelectric liquid crystal (AFLC) mode can be used.

The liquid crystal element controls transmission or non-transmission of light utilizing an optical modulation action of liquid crystal. Note that the optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

In one embodiment of the present invention, in particular, a reflective liquid crystal element can be used.

In the case where a reflective liquid crystal element is used, a polarizing plate is provided on the display surface side. In addition, a light diffusion plate is preferably provided on the display surface side to improve visibility.

[Light-emitting Element]

As the light-emitting element, a self-luminous element can be used, and an element whose luminance is controlled by current or voltage is included in the category of the light-emitting element. For example, an LED, a QLED, an organic EL element, an inorganic EL element, or the like can be used.

In one embodiment of the present invention, in particular, the light-emitting element preferably has a top emission structure. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used for the conductive layers. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

[Adhesive Layer]

As the adhesive layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

[Coloring Layer]

Examples of materials that can be used for the coloring layer include a metal material, a resin material, and a resin material containing a pigment or dye.

[Light-blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

The above is the description of each of the components.

[Modification Example]

Structure examples which partly differ from the display device described in the above cross-sectional structure example will be described below. Note that the description of the portions already described above is omitted and only different portions are described.

[Modification Example 1 of Cross-sectional Structure Example]

Figure 21:
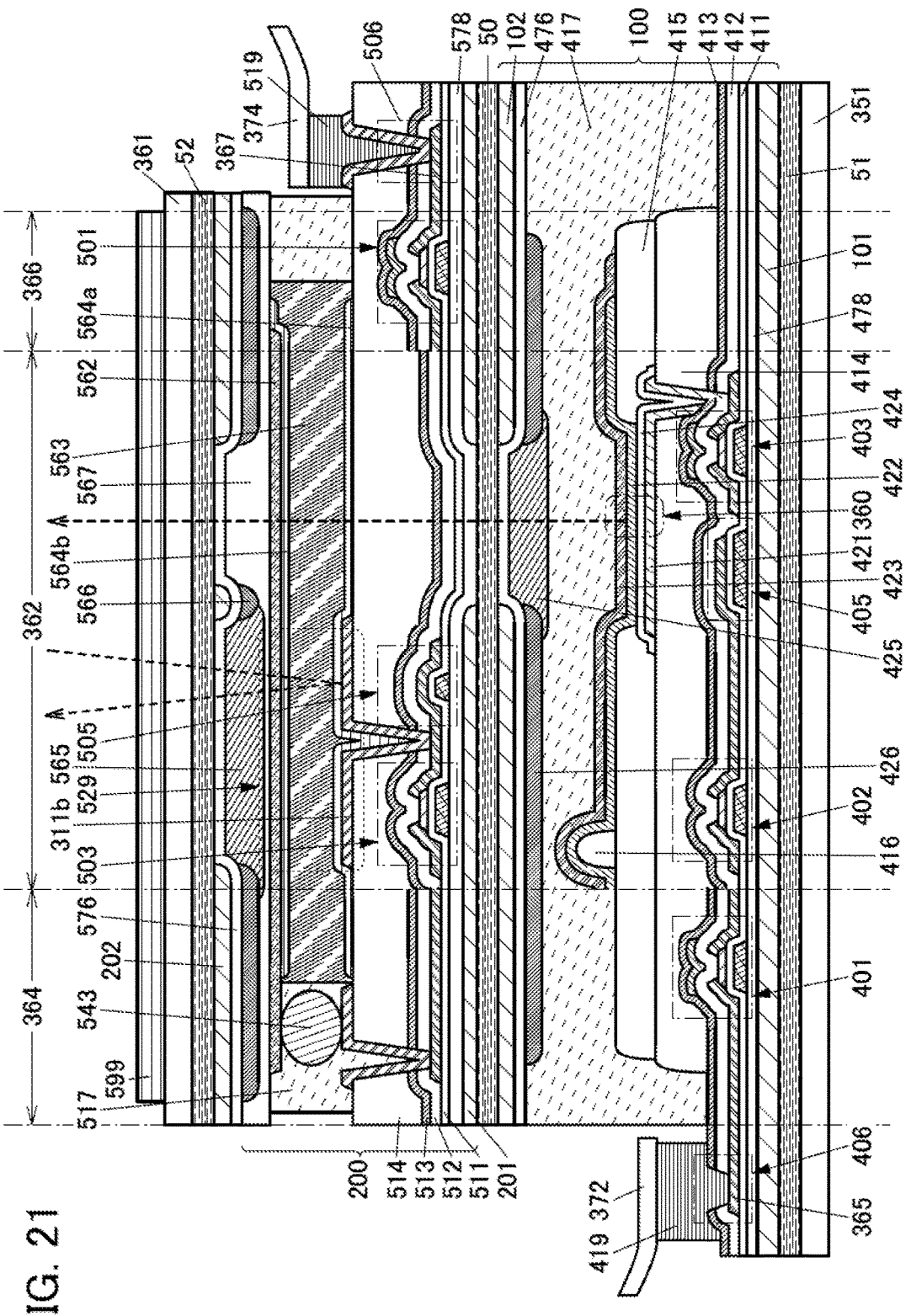
FIG. 21 illustrates a structure of a display device.

FIG. 21 is different from FIG. 20 in the structures of transistors and the resin layer 202 and in that a coloring layer 565, a light-blocking layer 566, and an insulating layer 567 are provided.

The transistors 401, 403, and 501 illustrated in FIG. 21 each include a second gate electrode. In this manner, a transistor including a pair of gates is preferably used as each of the transistors provided in the circuit portion 364 and the circuit portion 366 and the transistor that controls current flowing to the light-emitting element 360.

In the resin layer 202, an opening portion overlapping with the liquid crystal element 529 and an opening portion overlapping with the light-emitting element 360 are separately formed, whereby the reflectance of the liquid crystal element 529 can be increased.

The light-blocking layer 566 and the coloring layer 565 are provided on a surface of the insulating layer 576 on the liquid crystal element 529 side. The coloring layer 565 is provided so as to overlap with the liquid crystal element 529. Thus, the display panel 200 can perform color display. The light-blocking layer 566 has an opening portion overlapping with the liquid crystal element 529 and an opening portion overlapping with the light-emitting element 360. This allows fabrication of a display device that suppresses mixing of colors between adjacent pixels and thus has high color reproducibility.

[Modification Example 2 of Cross-sectional Structure Example]

Figure 22:
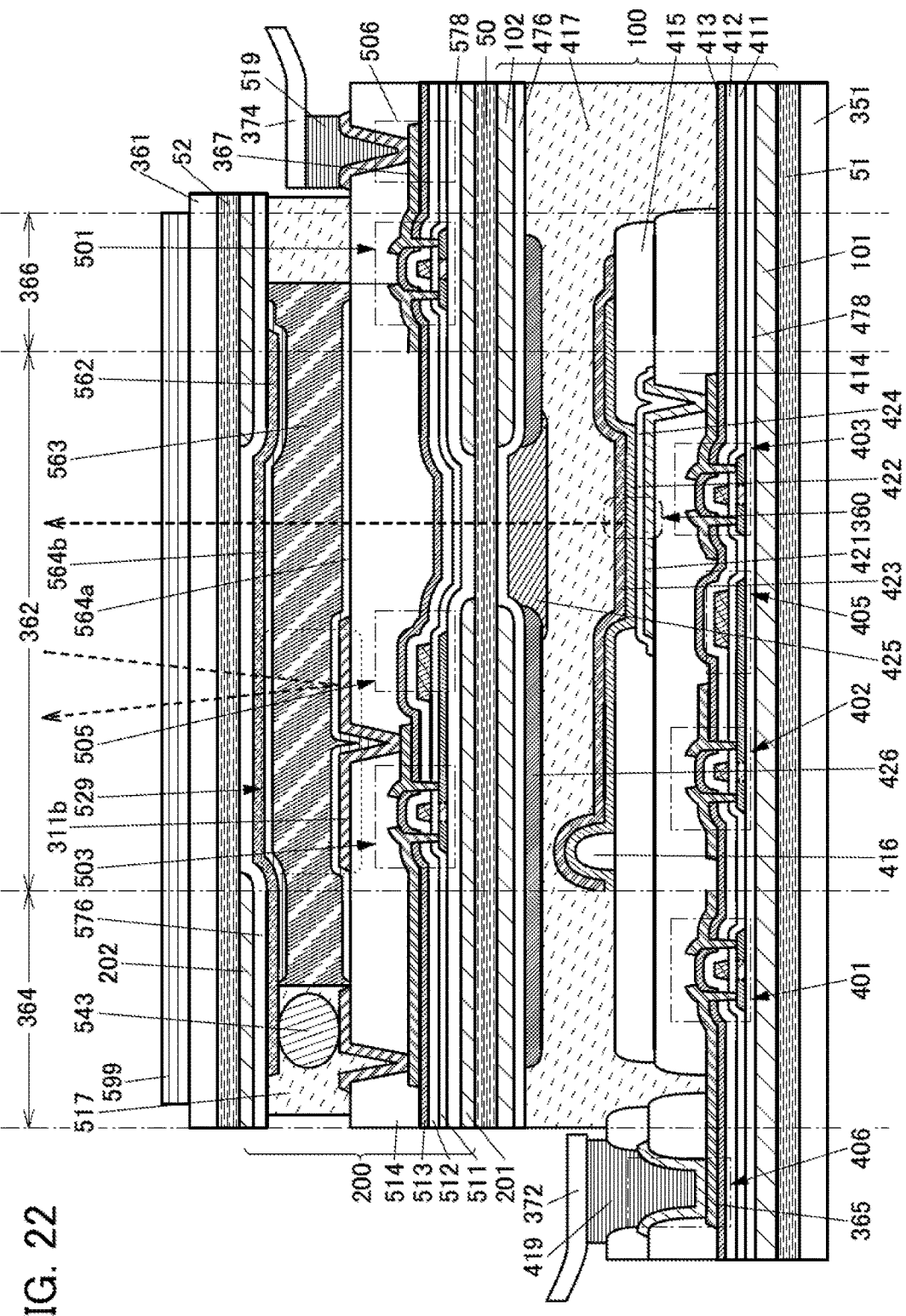
FIG. 22 illustrates a structure of a display device.

FIG. 22 illustrates an example in which a top-gate transistor is used as each transistor. The use of a top-gate transistor can reduce parasitic capacitance, leading to an increase in the frame frequency of display. Furthermore, a top-gate transistor can favorably be used for a large display panel with a size of 8 inches or more.

[Modification Example 3 of Cross-sectional Structure Example]

Figure 23:
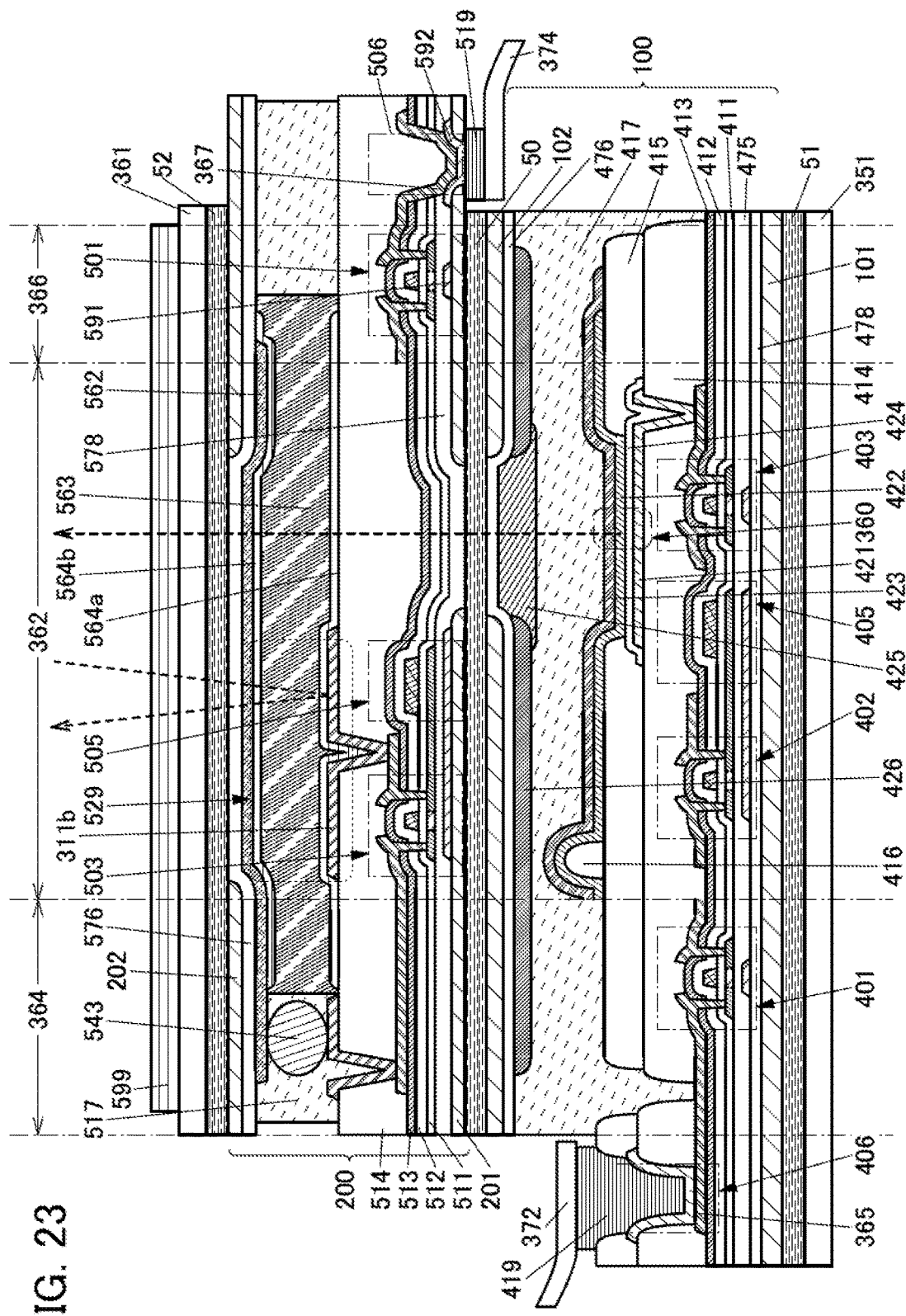
FIG. 23 illustrates a structure of a display device.

FIG. 23 illustrates an example in which a top-gate transistor including a second gate electrode is used as each transistor.

Each of the transistors includes a conductive layer 591 so as to overlap with a channel region. An insulating layer 475 or the insulating layer 578 is provided so as to cover the conductive layer 591.

In the connection portion 506 of the display panel 200, part of the resin layer 201 is opened, and a conductive layer 592 is provided so as to fill the opening. The conductive layer 592 is provided such that the back surface (a surface on the display panel 100 side) thereof is exposed. The conductive layer 592 is electrically connected to the wiring 367. The FPC 374 is electrically connected to the exposed surface of the conductive layer 592 through the connection layer 519. The conductive layer 592 can be formed by processing the conductive film with which the conductive layer 591 is formed. The conductive layer 592 functions as an electrode that can also be called a back electrode.

Such a structure can be obtained by using a photosensitive organic resin for the resin layer 201. For example, in forming the resin layer 201 over a support substrate, an opening portion is formed in the resin layer 201 and the conductive layer 592 is formed so as to fill the opening portion. When the resin layer 201 and the support substrate are separated from each other, the conductive layer 592 and the support substrate are also separated from each other, whereby the conductive layer 592 illustrated in FIG. 23 can be formed.

Such a structure allows the FPC 374 connected to the display panel 200 located on the display surface side to be positioned on the side opposite to the display surface. Thus, a space for bending the FPC 374 in incorporating a display device in an electronic device can be eliminated, which enables the electronic device to be smaller.

[Modification Example 4 of Cross-sectional Structure Example]

Figure 24:
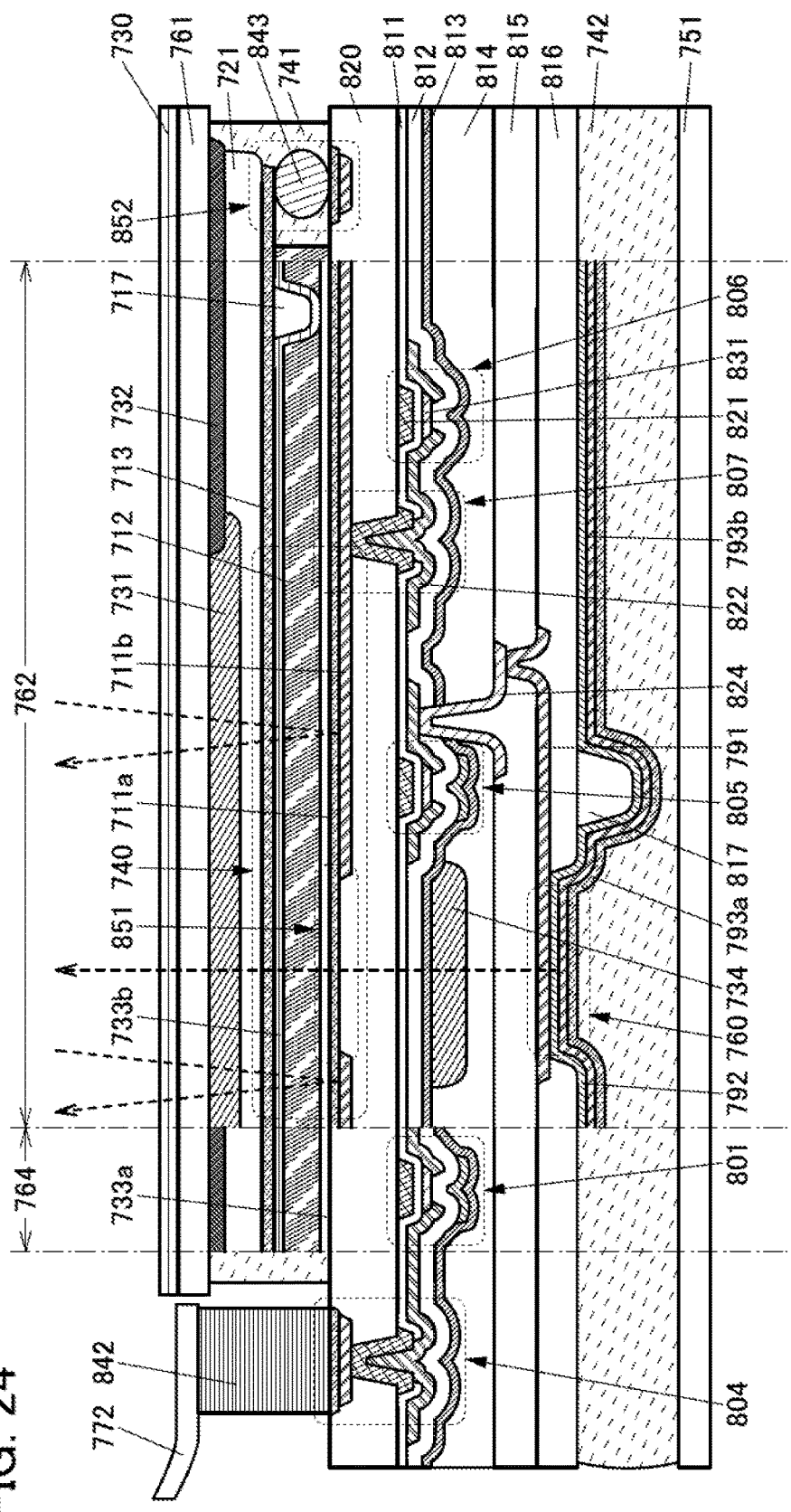
FIG. 24 illustrates a structure of a display device.

FIG. 24 illustrates an example of cross sections of the display portion 762 and the circuit portion 764 in a display device having a structure different from those of FIGS. 20 to 23.

The display panel includes an insulating layer 820 between the substrates 751 and 761. The display panel also includes the light-emitting element 760, a transistor 801, a transistor 805, a transistor 806, a coloring layer 734, and the like between the substrate 751 and the insulating layer 820. Furthermore, the display panel includes the liquid crystal element 740, the coloring layer 731, and the like between the insulating layer 820 and the substrate 761. The substrate 761 and the insulating layer 820 are bonded with an adhesive layer 741. The substrate 751 and the insulating layer 820 are bonded with an adhesive layer 742.

The transistor 806 is electrically connected to the liquid crystal element 740 and the transistor 805 is electrically connected to the light-emitting element 760. Since the transistors 805 and 806 are formed on a surface of the insulating layer 820 which is on the substrate 751 side, the transistors 805 and 806 can be formed through the same process.

The substrate 761 is provided with the coloring layer 731, a light-blocking layer 732, an insulating layer 721, and a conductive layer 713 serving as a common electrode of the liquid crystal element 740, an alignment film 733b, an insulating layer 717, and the like. The insulating layer 717 serves as a spacer for holding a cell gap of the liquid crystal element 740.

Insulating layers such as an insulating layer 811, an insulating layer 812, an insulating layer 813, an insulating layer 814, and an insulating layer 815 are provided on the substrate 751 side of the insulating layer 820. Part of the insulating layer 811 functions as a gate insulating layer of each transistor. The insulating layer 812, the insulating layer 813, and the insulating layer 814 are provided to cover each transistor. The insulating layer 815 is provided to cover the insulating layer 814. The insulating layers 814 and 815 each function as a planarization layer. Note that an example where the three insulating layers, the insulating layers 812, 813, and 814, are provided to cover the transistors and the like is described here; however, one embodiment of the present invention is not limited to this example, and four or more insulating layers, a single insulating layer, or two insulating layers may be provided. The insulating layer 814 functioning as a planarization layer is not necessarily provided when not needed.

The transistors 801, 805, and 806 each include a conductive layer 821 part of which functions as a gate, conductive layers 822 part of which functions as a source or a drain, and a semiconductor layer 831. Here, a plurality of layers obtained by processing the same conductive film are shown with the same hatching pattern.

The liquid crystal element 740 is a reflective liquid crystal element. The liquid crystal element 740 has a structure in which a conductive layer 711a, a liquid crystal 712, and the conductive layer 713 are stacked. A conductive layer 711b which reflects visible light is provided in contact with the surface of the conductive layer 711a that is on the substrate 751 side. The conductive layer 711b includes an opening 851. The conductive layers 711a and 713 contain a material transmitting visible light. In addition, an alignment film 733a is provided between the liquid crystal 712 and the conductive layer 711a and the alignment film 733b is provided between the liquid crystal 712 and the conductive layer 713. A polarizing plate 730 is provided on an outer surface of the substrate 761.

In the liquid crystal element 740, the conductive layer 711b has a function of reflecting visible light, and the conductive layer 713 has a function of transmitting visible light. Light that enters the substrate 761 side is polarized by the polarizing plate 730, passes through the conductive layer 713 and the liquid crystal 712, and is reflected by the conductive layer 711b. Then, the light passes through the liquid crystal 712 and the conductive layer 713 again and reaches the polarizing plate 730. In this case, the alignment of the liquid crystal 712 is controlled with a voltage that is applied between the conductive layer 711b and the conductive layer 713, and thus optical modulation of light can be controlled. That is, the intensity of light emitted through the polarizing plate 730 can be controlled. Light other than one in a particular wavelength region of the light is absorbed by the coloring layer 731, and thus, emitted light is red light, for example.

The light-emitting element 760 is a bottom-emission light-emitting element. The light-emitting element 760 has a structure in which a conductive layer 791, an EL layer 792, and a conductive layer 793b are stacked in this order from the insulating layer 820 side. In addition, a conductive layer 793a is provided to cover the conductive layer 793b. The conductive layer 793b contains a material reflecting visible light, and the conductive layers 791 and 793a contain a material transmitting visible light. Light is emitted from the light-emitting element 760 to the substrate 761 side through the coloring layer 734, the insulating layer 820, the opening 851, the conductive layer 713, and the like.

Here, as illustrated in FIG. 24, the conductive layer 711a transmitting visible light is preferably provided for the opening 851. In that case, the liquid crystal 712 has alignment in a region overlapping with the opening 851 as well as in the other regions; thus, an alignment defect of the liquid crystal is prevented from being caused in the boundary portion of these regions and undesired light leakage can be suppressed.

As the polarizing plate 730 provided on an outer surface of the substrate 761, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 740 are controlled in accordance with the kind of the polarizing plate so that desirable contrast is obtained.

The insulating layer 816 covering an end portion of the conductive layer 791 is provided with an insulating layer 817. The insulating layer 817 has a function of a spacer for preventing the insulating layer 820 and the substrate 751 from getting closer more than necessary. In addition, in the case where the EL layer 792 or the conductive layer 793a is formed using a shielding mask (metal mask), the insulating layer 817 may have a function of preventing the shielding mask from being in contact with a surface on which the EL layer 792 or the conductive layer 793a is formed. Note that the insulating layer 817 is not necessarily provided.

One of a source and a drain of the transistor 805 is electrically connected to the conductive layer 791 of the light-emitting element 760 through a conductive layer 824.

One of a source and a drain of the transistor 806 is electrically connected to the conductive layer 711b through a connection portion 807. The conductive layers 711b and 711a are in contact with and electrically connected to each other. Here, in the connection portion 807, the conductive layers provided on both surfaces of the insulating layer 820 are connected to each other through an opening in the insulating layer 820.

A connection portion 804 is provided in a region where the substrates 751 and 761 do not overlap with each other. The connection portion 804 is electrically connected to the FPC 772 through a connection layer 842. The connection portion 804 has a structure similar to that of the connection portion 807. On the top surface of the connection portion 804, a conductive layer obtained by processing the same conductive film as the conductive layer 711a is exposed. Thus, the connection portion 804 and the FPC 772 can be electrically connected to each other through the connection layer 842.

A connection portion 852 is provided in part of a region where the adhesive layer 741 is provided. In the connection portion 852, the conductive layer obtained by processing the same conductive film as the conductive layer 711a is electrically connected to part of the conductive layer 713 with a connector 843. Accordingly, a signal or a potential input from the FPC 772 connected to the substrate 751 side can be supplied to the conductive layer 713 formed on the substrate 761 side through the connection portion 852.

The above is the description of the modification examples.

At least part of this embodiment can be implemented in appropriate combination with any of the other embodiments described in this specification.

(Embodiment 5)

[Composition of CAC-OS]

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

This application is based on Japanese Patent Application serial no. 2016-131271 filed with Japan Patent Office on Jul. 1, 2016, Japanese Patent Application serial no. 2016-131274 filed with Japan Patent Office on Jul. 1, 2016, and Japanese Patent Application serial no. 2016-135774 filed with Japan Patent Office on Jul. 8, 2016, the entire contents of which are hereby incorporated by reference.

What is claimed is:

1. An electronic device comprising:
   a housing comprising a first surface and a second surface which faces the first surface;
   a display portion on the first surface of the housing, the display portion comprising:
      a first display element capable of reflecting visible light; and
      a second display element capable of emitting visible light;
   an imaging portion configured to take an image of an object;
   a control portion configured to control the display portion and the imaging portion;
   an input portion configured to input a signal for controlling the display portion and the imaging portion to the control portion; and
   a sensor portion configured to measure illuminance of external light and configured to output sensing data to the control portion, and further configured to output positional data of the object to the control portion,
   wherein at least part of the imaging portion is provided for the second surface of the housing,
   wherein the sensor portion comprises a position detection sensor,
   wherein the position detection sensor is provided for the first surface of the housing, and
   wherein the display portion is configured to display the image using one of or both first light reflected by the first display element and second light emitted from the second display element.

2. The electronic device according to claim 1, wherein the first display element is a reflective liquid crystal element.

3. The electronic device according to claim 1, wherein the second display element is an electroluminescent element.

4. The electronic device according to claim 1,
wherein the display portion further comprises a first circuit and a second circuit,
wherein the first circuit is electrically connected to the first display element,
wherein the second circuit is electrically connected to the second display element, and
wherein the second display element is positioned between the first circuit and the second circuit.

5. The electronic device according to claim 4,
wherein the second display element comprises:
a first conductive layer capable of transmitting visible light;
a second conductive layer; and
a layer between the first conductive layer and the second conductive layer, the layer comprises a light-emitting material,
wherein the first conductive layer is electrically connected to a wiring to which a constant potential is applied, and
wherein the first conductive layer is positioned between the first circuit and the second circuit.

6. A driving method for an electronic device, comprising the steps of:
measuring illuminance of external light by a photosensor included in a sensor portion;
outputting sensing data from the sensor portion to a control portion;
inputting a signal from an input portion to the control portion for controlling a display portion and an imaging portion;
taking an image of an object by the imaging portion;
sensing the object to the control portion by a position detection sensor included in the sensor portion;
displaying the image by a first display element included in the display portion when the illuminance is higher than or equal to first illuminance;
displaying the image by a second display element included in the display portion when the illuminance is lower than the first illuminance;
displaying the image by the first display element when the position detection sensor detects the object; and
displaying the image by both the first display element and the second display element when the position detection sensor does not detect the object,
wherein the first display element is capable of reflecting visible light,
wherein the second display element is capable of emitting visible light,
wherein the first illuminance is higher than or equal to 300 lx and lower than or equal to 20000 lx,
wherein the display portion is provided for a first surface of a housing,
wherein at least part of the imaging portion is provided for a second surface of the housing,
wherein the photosensor is provided for a third surface of the housing,
wherein the position detection sensor is provided for the first surface of the housing,
wherein the second surface of the housing faces the first surface of the housing, and
wherein the third surface of the housing is in contact with the first surface of the housing and the second surface of the housing.

7. The driving method for the electronic device, according to claim 6, wherein the position detection sensor is capable of detecting the object with an angle of view of larger than or equal to 1° and smaller than or equal to 20°.

8. The driving method for the electronic device, according to claim 6, wherein the position detection sensor is capable of detecting the object with a distance of longer than or equal to 100 mm and shorter than or equal to 500 mm.

9. A driving method for an electronic device, comprising the steps of:
measuring first illuminance of external light by a first photosensor in a sensor portion;
measuring second illuminance of external light by a second photosensor in the sensor portion;
outputting sensing data from the sensor portion to a control portion;
inputting a signal from an input portion to the control portion for controlling a display portion and an imaging portion;
taking an image of an object by the imaging portion;
displaying the image by a first display element included in the display portion when the first illuminance is higher than the second illuminance; and
displaying the image by a second display element included in the display portion when the first illuminance is lower than the second illuminance,
wherein the first display element is capable of reflecting visible light,
wherein the second display element is capable of emitting visible light,
wherein each of the display portion and the first photosensor is provided for a first surface of a housing,
wherein each of the second photosensor and at least part of the imaging portion is provided for a second surface of the housing, and
wherein the second surface of the housing faces the first surface of the housing.

10. The driving method for an electronic device according to claim 9,
wherein the image is displayed by one of the first display element and the second display element when the first illuminance is lower than the second illuminance, and
wherein the image is displayed by both the first display element and the second display element when the first illuminance is higher than the second illuminance.

11. An electronic device comprising:
a housing comprising a first surface and a second surface which faces the first surface;
a display portion on the first surface of the housing, the display portion comprising:
a first display element capable of reflecting visible light; and
a second display element capable of emitting visible light;
an imaging portion configured to take an image of an object;
a control portion configured to control the display portion and the imaging portion;
an input portion configured to input a signal for controlling the display portion and the imaging portion to the control portion; and
a first photosensor and a second photosensor which are configured to measure illuminance of external light and are configured to output sensing data to the control portion,
wherein at least part of the imaging portion is provided for the second surface of the housing, wherein the first photosensor is provided for the first surface of the housing,
wherein the second photosensor is provided for the second surface of the housing, and
wherein the display portion is configured to display the image using one of or both first light reflected by the first display element and second light emitted from the second display element.

* * * * *